United States Patent
Youssef et al.

[11] Patent Number: 6,075,742
[45] Date of Patent: Jun. 13, 2000

[54] INTEGRATED CIRCUIT FOR SWITCHING FROM POWER SUPPLY TO BATTERY, INTEGRATED LATCH LOCK, AND ASSOCIATED METHOD FOR SAME

[75] Inventors: Tom Youssef, Dallas; David Charles McClure, Carrrollton, both of Tex.

[73] Assignee: STMicroelectronics, Inc., Carrollton, Tex.

[21] Appl. No.: 09/002,484

[22] Filed: Dec. 31, 1997

[51] Int. Cl.[7] .................................................. G11C 7/00
[52] U.S. Cl. .......................... 365/229; 365/226; 365/227; 365/203
[58] Field of Search .................................. 365/229, 227, 365/233, 243, 175, 203, 226

[56] References Cited

U.S. PATENT DOCUMENTS

| | | | |
|---|---|---|---|
| 5,008,776 | 4/1991 | Queyssac | 361/392 |
| 5,031,092 | 7/1991 | Edwards et al. | 364/200 |
| 5,089,877 | 2/1992 | Queyssac et al. | 357/70 |
| 5,115,146 | 5/1992 | McClure | 307/272.3 |
| 5,121,358 | 6/1992 | Slemmer et al. | 365/226 |
| 5,134,587 | 7/1992 | Steele | 365/201 |
| 5,144,582 | 9/1992 | Steele | 365/189.08 |
| 5,161,159 | 11/1992 | McClure et al. | 371/22.1 |
| 5,204,279 | 4/1993 | Chan et al. | 437/47 |
| 5,557,188 | 9/1996 | Piercey | 320/5 |
| 5,892,893 | 4/1999 | Hanf et al. | 395/182.01 |

*Primary Examiner*—David Nelms
*Assistant Examiner*—Thong Le
*Attorney, Agent, or Firm*—Theodore E. Galanthay; Lisa K. Jorgenson; Christopher F. Regan

[57] ABSTRACT

An integrated circuit and associated method for switching from a power supply to a battery are provided. The integrated circuit preferably includes a memory circuit responsive to an external power supply and to a battery for storing data therein and a sleep mode latching circuit connected to the memory circuit for latching the memory circuit in a reduced power sleep mode condition so as to reduce power usage of a battery and a non-sleep mode operating condition so as to allow normal operation of the memory circuit by a power supply. The integrated circuit preferably also includes a sleep mode latch locking circuit connected to the sleep mode latching circuit and the memory circuit and responsive to a power supply for locking the sleep mode latching circuit in the non-sleep mode operating condition when power supplied from the power supply falls below a predetermined threshold so that the memory circuit is inhibited from inadvertently entering the reduced power sleep mode condition.

65 Claims, 17 Drawing Sheets

INTEGRATED CIRCUIT FOR SWITCHING FROM POWER SUPPLY TO BATTERY, INTEGRATED LATCH LOCK, AND ASSOCIATED METHOD FOR SAME

FIELD OF THE INVENTION

The invention relates to the field of integrated circuits, and, more particularly, to the low power integrated circuits.

BACKGROUND OF THE INVENTION

Over the years, integrated circuit technology has steadily advanced so that various integrated circuit technology has penetrated the very fabric of our daily work, home, leisure, and recreation environments. As application and uses of integrated circuit technology have increased steadily, a demand for lower and lower power consumption, more and more functional capacity within a small area, and higher and higher quality products have likewise continued to increase. Accordingly, low power integrated circuit technology, such as complimentary metal oxide semiconductor ("CMOS"), has become more widespread.

Some of the low power integrated circuits, e.g., CMOS technology, include circuits or devices which consume little or no power and are known as "zero power" devices. Examples of zero power integrated circuit modules can be seen in U.S. Pat. Nos. 5,089,877 and 5,008,776 by Queyssac et al. and which are also assigned to the common assignee of the present application.

A problem, however, has developed with some low power or zero power devices, e.g., asynchronous static random access memory ("SRAM") devices, whereby accidental entry into "sleep mode" can occur. Sleep mode is a mode of operation in which a memory array and an oscillator, for example, of the device are disconnected from the power supply. For example, the memory array may have a p-channel switch which can be switched off when in a sleep mode. The sleep mode allows the primary contributors to battery current (e.g., a memory array (polysilicon resistor) and a clock oscillator) to be switched off. This is particularly useful when the battery is attached to the device during assembly.

During battery attach, for example, it can be useful to have the device automatically go into sleep mode as the battery is attached. Then the battery voltage can be measured to verify continuity and that no shorts exist across the battery. If not for the sleep mode, it can be hard to distinguish normal battery current (including the memory array and the oscillator) from some low level continuity problem.

As external power or $V_{CC}$ is applied to the device during post-battery attach testing, the device exits sleep mode as external power or $V_{CC}$ exceed the battery voltage. Then the memory array can be exercised. At the end of testing (and before the device is shipped), a register is written to place the device back into sleep mode. Thus, there is no appreciable drain on the battery before the customer is ready to use the device. Once the customer finally applies external power or $V_{CC}$ to the device, and it exceeds the battery voltage, the device exits sleep mode and operates normally. There is no further need to enter sleep mode from this point on, and the user has no means to put the device in sleep mode. As can be seen, devices sitting on the shelf prior to use by the customer generally experience no degradation in battery life.

Nevertheless, in some environments, the sleep mode circuitry can be corrupted. This can cause some devices to be accidentally placed in sleep mode and destroy data in the memory array. Sometimes, for example, pins may go below a reference or ground voltage or $V_{SS}$ for relatively long periods of time. This can forward bias parasitic diodes and/or bipolar transistors and pull down the battery voltage seen by the device. Once this undershoot condition goes away, the battery voltage which is switched into the device will return to its original value. This situation can look like a battery attach event, and the circuitry can cause sleep mode to be entered again. Alternatively, latches storing the sleep mode as a non-sleep mode state can become corrupted. Also, in this situation, power to the memory array can be disconnected and data can be corrupted or destroyed.

SUMMARY OF THE INVENTION

In view of the foregoing background, the present invention advantageously provides an integrated circuit which inhibits corruption or destruction of data in a memory circuit such as when power is switched or shifted from an external power supply to a battery or other back-up power source. The present invention also advantageously provides an integrated circuit which reduces an uncertainty of or a potential for corruption of data in electronic circuits when an external power supply falls below a predetermined threshold for short periods of time, e.g., during undershoot conditions. The present invention additionally advantageously provides an integrated latch circuit which maintains its state during power failures or undershoots for electronic circuits that neither use nor require polysilicon resistors.

More particularly, according to the present invention, an integrated circuit for switching from an external power supply to a backup battery associated with the integrated circuit is provided to thereby preserve data in the event of loss of power from the external power supply. The integrated circuit preferably includes a memory circuit, e.g., preferably provided by a memory cell array such as associated with random access memory ("RAM") device or SRAM device, responsive to an external power supply and to a backup battery for storing data therein. Sleep mode latching means, e.g., preferably provided by a sleep mode latch circuit, is connected to the memory circuit for latching the memory circuit in a reduced power sleep mode condition so as to reduce power usage of a backup battery and a non-sleep mode operating condition so as to allow normal operation of the memory circuit by an external power supply. The integrated circuit also preferably includes sleep mode latch locking means, e.g., preferably provided by a sleep mode latch locking circuit, connected to the sleep mode latching means and the memory circuit and responsive to an external power supply for locking the sleep mode latching means in the non-sleep mode operating condition when power supplied from the external power supply falls below a predetermined threshold so that the memory circuit is inhibited from inadvertently entering the reduced power sleep mode condition and thereby inhibiting corruption of data stored therein.

The present invention also provides an integrated latch locking circuit for inhibiting latch entry into a reduced power mode. The integrated latch locking circuit preferably includes a power supply determining circuit for determining when the power from a power supply falls below a predetermined threshold and a charge holding circuit adapted to be connected to a latch circuit for holding a charge so as to supply a predetermined amount of power for a predetermined period of time when the power from the power supply falls below the predetermined threshold.

The present invention further provides a method of switching from a power supply to a battery. The method preferably includes latching a memory circuit in a reduced power sleep mode condition so as to reduce power usage of a battery and a non-sleep mode operating condition so as to allow normal operation of the memory circuit by a power supply. The method also preferably includes locking in the non-sleep mode operating condition when power supplied from the power supply falls below a predetermined threshold so that the memory circuit is inhibited from inadvertently entering the reduced power sleep mode condition and thereby inhibiting corruption of data stored therein.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime, double prime and triple prime notations are used to indicate similar elements in alternative embodiments.

Figure 1:
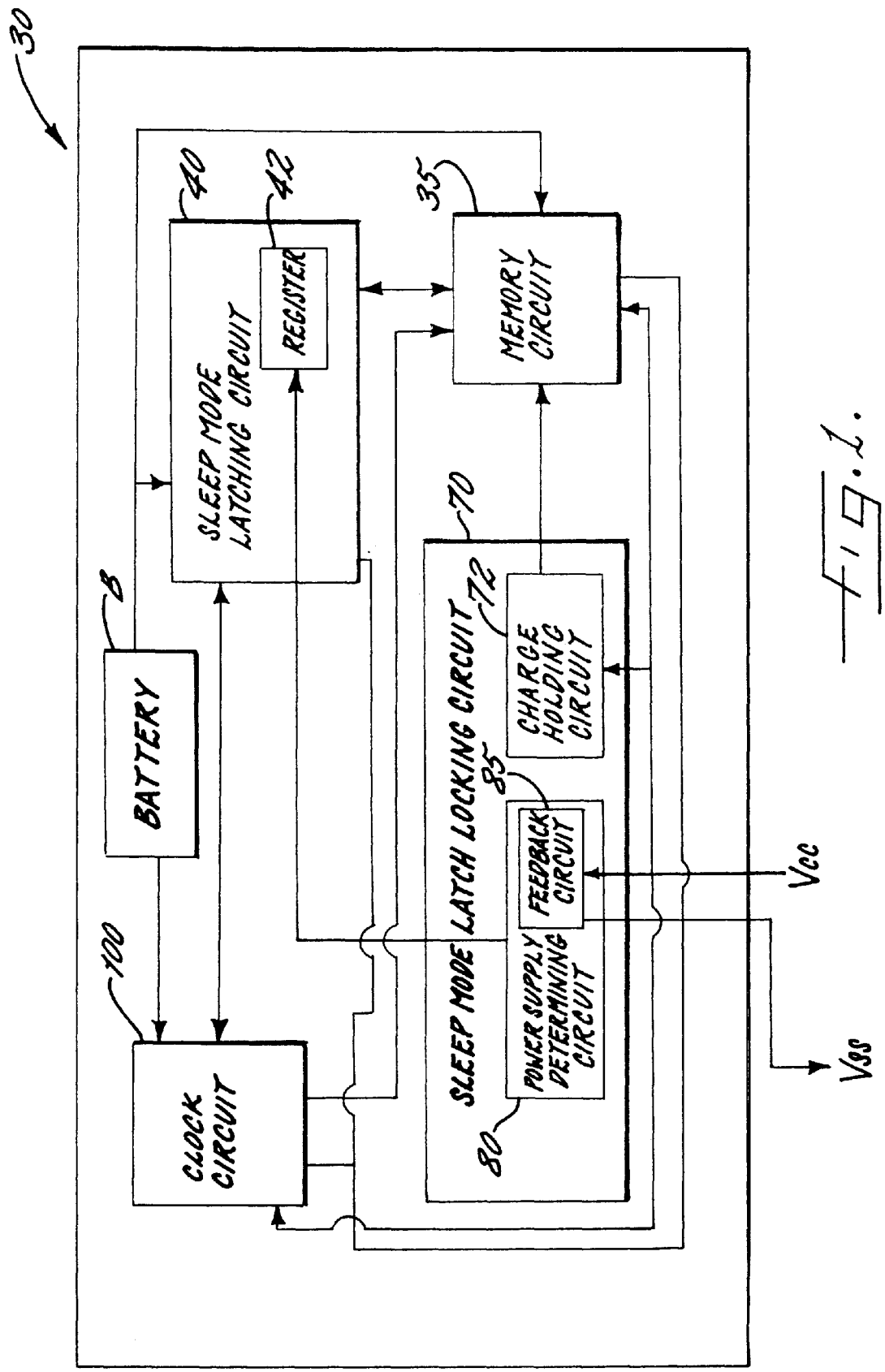
FIG. 1 is a schematic block diagram of an integrated circuit for switching from an external power supply to a battery according to the present invention.

FIG. 1 illustrates an integrated circuit 30 according to the present invention for switching from a power supply $V_{CC}$, e.g., preferably an external power supply, to a battery B such as a backup battery mounted in association with the integrated circuit 30 to thereby preserve data in the event of loss of power from the external power supply. The integrated circuit 30 preferably includes a memory circuit 35, e.g., preferably provided by a memory cell array such as a RAM or SRAM, responsive to an external power supply $V_{CC}$ and to a backup battery B for storing data therein. The integrated circuit 30 also preferably includes sleep mode latching means, e.g., a sleep mode latch or latching circuit 40, connected to the memory cell array 35 for latching the memory cell array 35 in a reduced power sleep mode condition so as to reduce power usage of a backup battery B and a non-sleep mode operating condition so as to allow normal operation of the memory cell array 35 by an external power supply $V_{CC}$.

Figure 2:
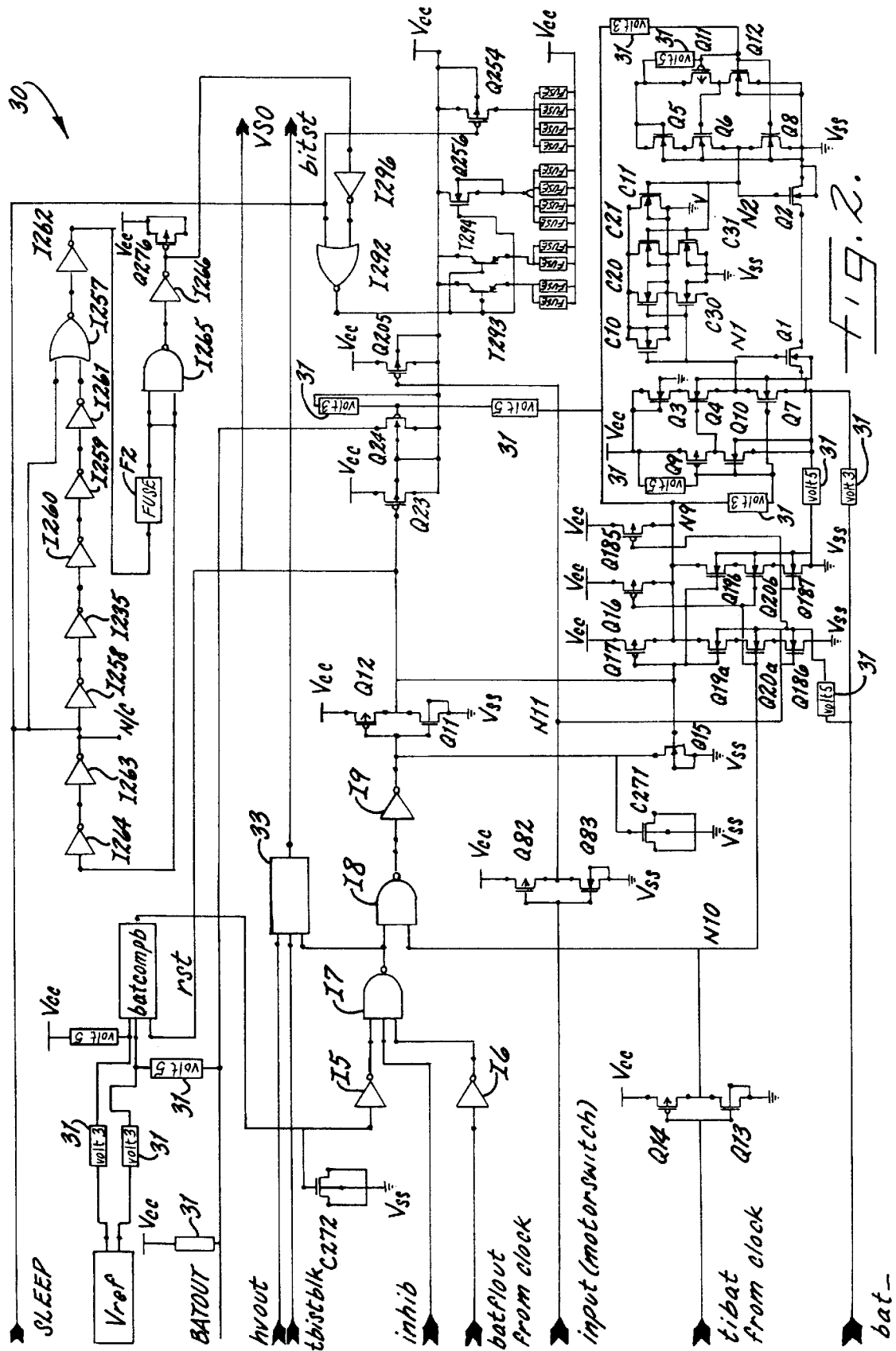
FIG. 2 is a schematic diagram of an integrated circuit for switching from an external power supply to a battery according to a first embodiment of the present invention.

As shown in FIGS. 1–2, sleep mode latch locking means, e.g., a latch locking circuit 70, is preferably connected to the sleep mode latching means 40 and the memory cell array 35 and responsive to an external power supply 25 for locking the sleep mode latching means 40 in the non-sleep mode operating condition when power supplied from the external power supply $V_{CC}$ falls below a predetermined threshold so that the memory cell array 35 is inhibited from inadvertently entering the reduced power sleep mode condition and thereby inhibiting corruption or destruction of data stored therein. As understood by those skilled in the art, the integrated circuit 30 also preferably includes a clock circuit 100 connected to the memory cell array 35 for providing timekeeping signals to the memory cell array 35. The clock circuit 100, e.g., an oscillator circuit as understood by those skilled in the art, is also responsive to the sleep mode latching means 40 to thereby also operate in the reduced power sleep mode condition.

The sleep mode latching circuit 40 preferably includes a register 42 for retaining sleep mode operating data. The sleep mode latch locking circuit 70 preferably includes an external power supply determining circuit 80 connected to the register 42 for determining when the power from the external power supply $V_{CC}$ falls below the predetermined threshold. The external power supply determining circuit 80 includes a feedback hysteresis circuit 85 for providing hysteresis feedback on the power supply $V_{CC}$. The feedback hysteresis circuit 85 (as perhaps best shown in FIG. 11) includes an inverter circuit 87, e.g., provided by a pair of inverters I18, I104 connected in series and connected to the register 42 and a transistor Q140 connected to the inverter circuit 85, a ground potential $V_{SS}$, and the memory cell array 35 so as to lock the sleep mode operating data in the register 42 when power from an external power supply $V_{CC}$ falls below the predetermined threshold (see, e.g., FIG. 6). The inverter circuit 85 is also preferably responsive to power from an external power supply $V_{CC}$ rising above the predetermined threshold so as to overcome the transistor 82.

Figure 11:
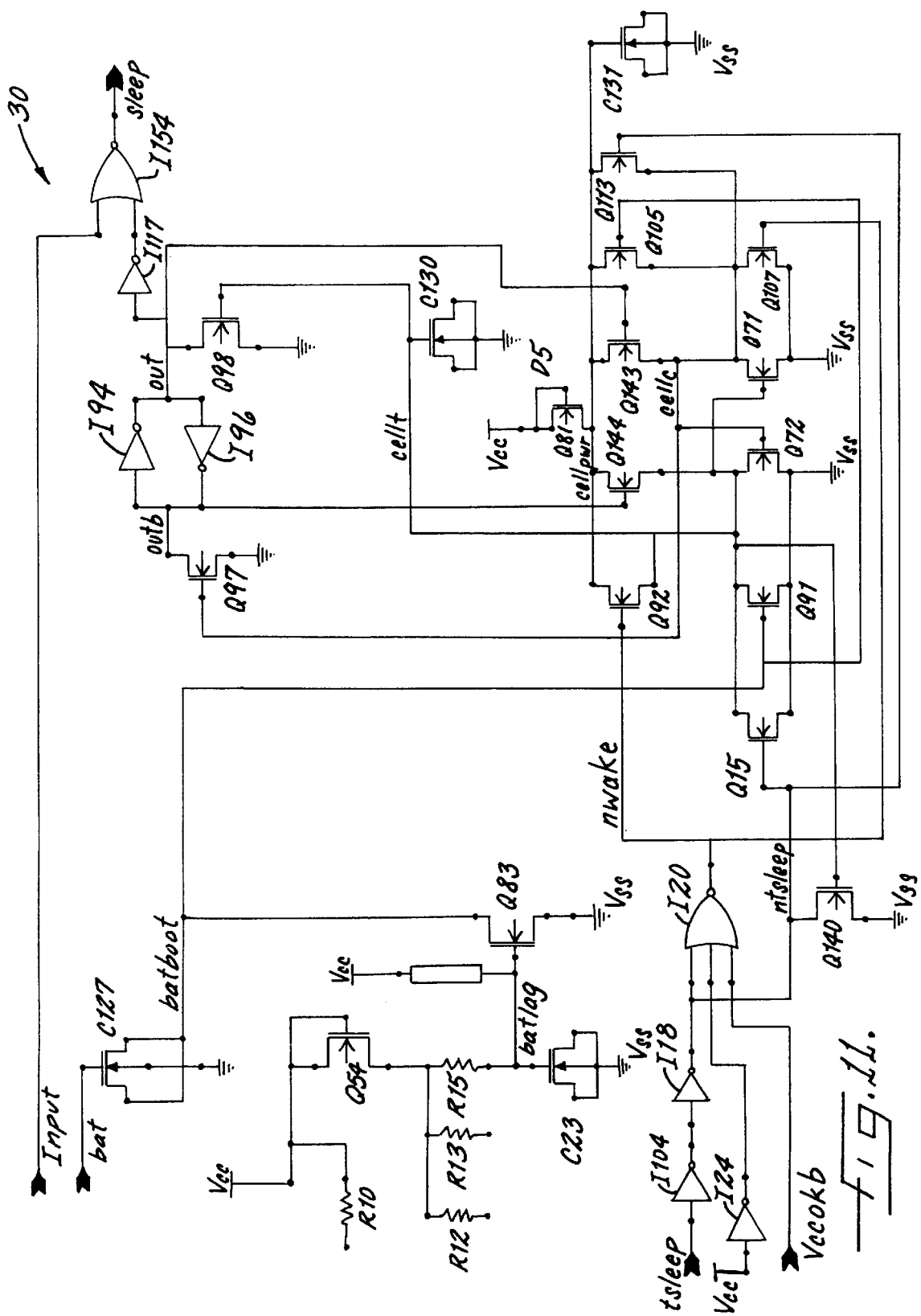
FIG. 11 is a schematic diagram of an integrated circuit for switching from an external power supply to a battery according to a third embodiment of the present invention.

The sleep mode latch locking circuit 70 preferably also includes charge holding means, e.g., a charge holding circuit 72, connected to the memory cell array 35 and to an external power supply $V_{CC}$ for holding a charge so as to supply a predetermined amount of power to the memory cell array 35 for a predetermined period of time when the power from the external power supply $V_{CC}$ falls below the predetermined threshold. The charge holding circuit 72 preferably includes at least one capacitor, and more preferably includes a pair of capacitors C130, C131 as illustrated in FIG. 11. The charge holding circuit 72 also has a transistor 75 connected to the at least one capacitor C130, C131 and at least one diode D5 forwardly biased from an external power supply $V_{CC}$ and connected to the transistor Q81 so that when power from the external power supply $V_{CC}$ falls below the predetermined threshold the at least one diode D5 inhibits a charge stored in the at least one capacitor C130, C131 from discharging.

As also shown in FIG. 1, the sleep mode latching circuit 40 is further responsive to a battery connecting condition to thereby provide testing capabilities for a battery B being connected to the integrated circuit 30 and is further responsive to an external power supply $V_{CC}$ being initially supplied to the integrated circuit 30 after a battery B has been connected thereto and exceeding a battery power supply threshold to thereby exit the reduced power sleep mode condition and enter the non-sleep mode operating condition.

Figure 17:
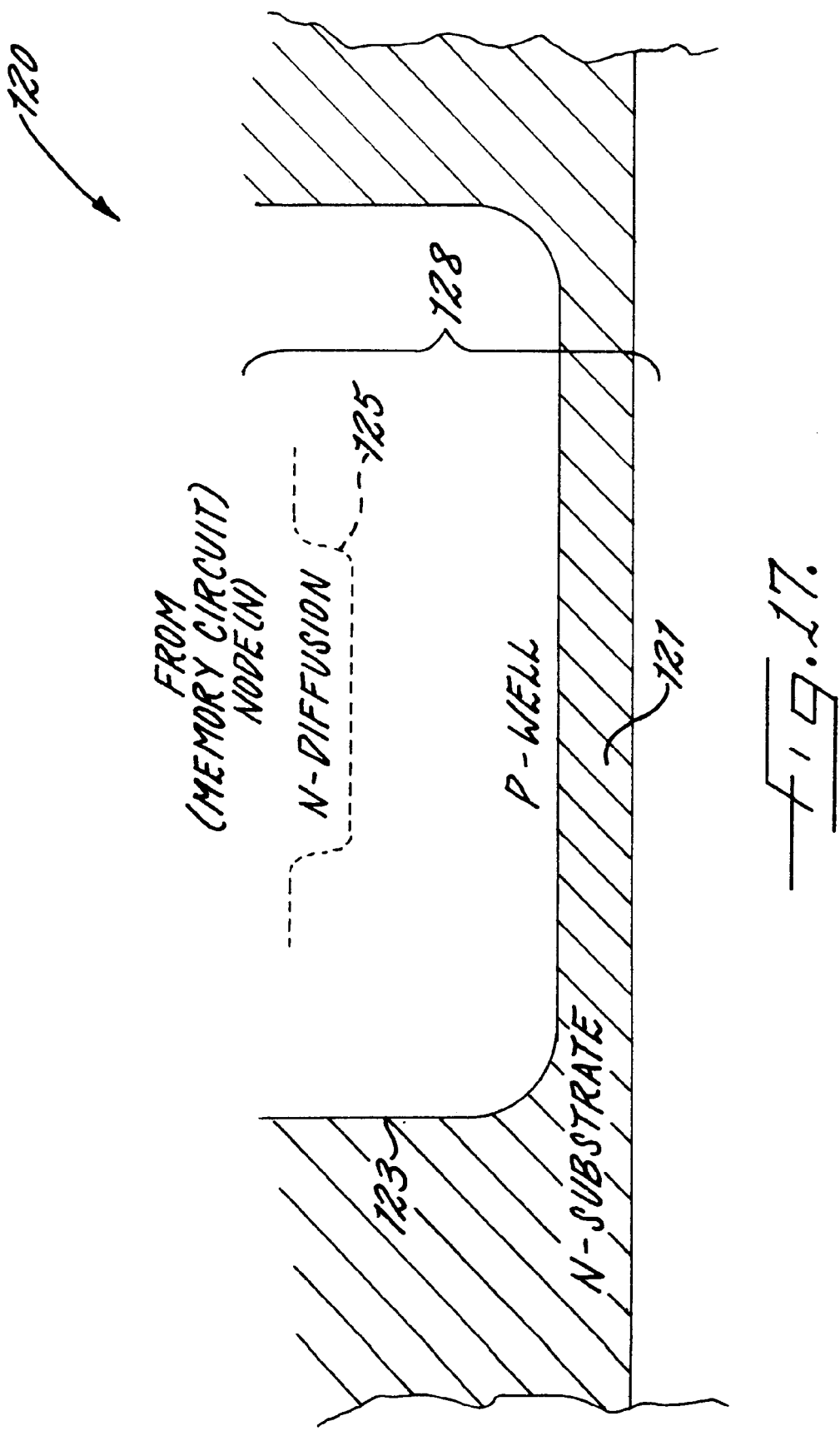
FIG. 17 is an enlarged schematic view of a parasitic leak controlling transistor of an integrated circuit according to the present invention.

Advantageously, as best shown in FIGS. 1 and 17, the integrated circuit 30 also preferably includes parasitic leak controlling means 120 associated with at least the memory cell array 35 for controlling leakage from at least one node N of the at least the memory cell array 35 down from a high voltage level. At least the memory cell array 35, and preferably other circuit portions of the integrated circuit 30, is formed in a substrate 121 having a first conductivity type, e.g., an N-substrate and at least one well 123 having a second conductivity type, e.g., a p-well. At least the memory cell array 35 also preferably includes at least one diffusion region 125 having the first conductivity type formed in the at least one well 123 so that the combination of the at least one diffusion region 125, the at least one well 123, and the substrate 121 forms a bipolar transistor 128 at the at least one node N of at least the said memory cell array 35 and thereby define the parasitic leak controlling means 120.

In operation, and more particularly as illustrated in FIG. 2, a batout signal is connected to the battery positive terminal and a bat_signal is connected to the battery negative terminal via a resistor (not shown). Also a batout signal is hardwired to a substrate which is connected to the power supply $V_{CC}$. The bat_signal is the signal being switched by the integrated circuit 30.

The integrated circuit 30 as illustrated, for example, can include a sleep mode, testing modes, e.g., battery and memory, and a normal operating mode. The integrated circuit 30 can also be connected for either 3 volt or 5 volt operations as illustrated by the 3-volt and 5-volt metal option connectors 31 throughout the circuit. The circuit 30, as illustrated, includes a plurality of inverters I264, I263, I258, I235, I260, I259, I261 connected in series, e.g., an output of one to the input of the next one, to an input line of a NOR gate I257. Another input line of the NOR gate I257 is also connected to a sleep line. The output of the NOR gate I257 is connected to another inverter I262 which, in turn, is connected in series to a fuse or fuse circuit F2. The fuse circuit F2 and the input of a first inverter I264 of the plurality of inverters are connected to a NAND gate I265. The output of the NAND gate is connected to an inverter I266 which is then connected to a transistor, i.e., PMOS, Q276. The drain and the source of the transistor is connected to the power supply $V_{CC}$. The output of the inverter I266 is also connected to an input of another inverter I296 which has an output connected to an input of another NOR gate I292. The NOR gate I292 also has an input connected to the sleep line as illustrated.

Also, the output of the NOR gate I292 is connected to the respective bases of a pair of bipolar transistors T293, T294 having collectors thereof connected to the power supply $V_{CC}$ and emitters thereof connected to a fuse network as illustrated. The output of the NOR gate I292 is also preferably connected to a gate of a transistor, e.g., NMOS, Q256 having a drain connected to the power supply and a source connected to the fuse network. The input of the NOR gate I292, i.e., connected to the sleep line is also connected to a transistor, e.g., PMOS, Q254 which also has a drain connected to the power supply and a source connected to the fuse network. The fuse network, for example, has two fuses connected to each of the emitters of the bipolar transistors T293, T294 and four fuses connected to the sources of the MOS transistors Q256, Q254. The fuses are also connected to the power supply.

Additionally, a reference voltage circuit $V_{ref}$ is connected to a comparator circuit batcompb. The comparator circuit batcompb is also connected to the external power supply or voltage $V_{CC}$ and a reset rst line and compares the battery voltage with the external voltage from the external power supply.

For test mode operations, for example, for the battery and memory circuit, the integrated circuit 30 can also include inputs or connections from a high voltage output hvout line, a test bit stream block tbistblk line, an inhibit inhib line, a battery float batfloat line, a memory circuit test mct line (see FIG. 2), and a timing battery test tibat line from a clock. A test mode clearing circuit 33 has in input connected to the hvout line, the tbistblk line, and an adjusted reference voltage vsorst line. The output of the test mode clearing circuit 33 is the bitst line.

An output of the comparator circuit batcompb is connected to an N-depletion capacitor C272 which is also connected to ground $V_{SS}$ and to an input of an inverter I5. The output of the inverter I5 is connected to a NAND gate I7 which also receives inputs from the inhib line, e.g., an analog circuit line when the battery is being used, and the output of an inverter I6 connected to the batfloat line as illustrated. The output of the NAND gate I7 is connected to the test mode clearing circuit 33 and as an input to another NAND gate I8. The tibat line is connected to a pair of transistors Q13, Q14, i.e., NMOS and PMOS, which are also connected to the external power supply and provide an output also connected to the NAND gate I8.

The output of the NAND gate I8 is connected to another inverter I9 which has an output connected to a pair of transistors Q11, Q12, i.e., NMOS, PMOS, also connected to the external power supply. The transistors Q11, Q12, in turn, have outputs connected to yet another series of transistors Q23, Q24, i.e., PMOS, which are also connected to the external power supply. One of the transistors Q24 is also connected to the batout line as illustrated. Another of the transistors Q23 has a gate also connected to the reset rst line and a oscillator vso line. Also, the input mct line is also connected to a pair of transistors Q82, Q83, i.e., NMOS and PMOS, having outputs connected to the gate of the transistor Q205, e.g., at a node N11.

Further, connected between a node N11 and a node N9 of the circuit 30, as well as other portions thereof, the circuit 30 includes a plurality of transistors Q17, Q16, Q185, i.e., PMOS, connected to the external power supply and a plurality of transistors Q19a, Q19b, Q20a, Q20b, Q186, Q187, i.e., NMOS, connected to ground $V_{SS}$ and to the other PMOS transistors Q17, Q16, Q185. Another N-depletion capacitor C271 is also connected to the output of the inverter I9 and to a transistor Q15. Both of the capacitor C271 and the transistor Q15 are also connected to ground.

In a noisy system or circuit environment, for example, sometimes during a power down, a negative spike is generated on input control pins, which causes the substrate to go to zero or below for short times, e.g., less than one to two microseconds.

Figure 3:
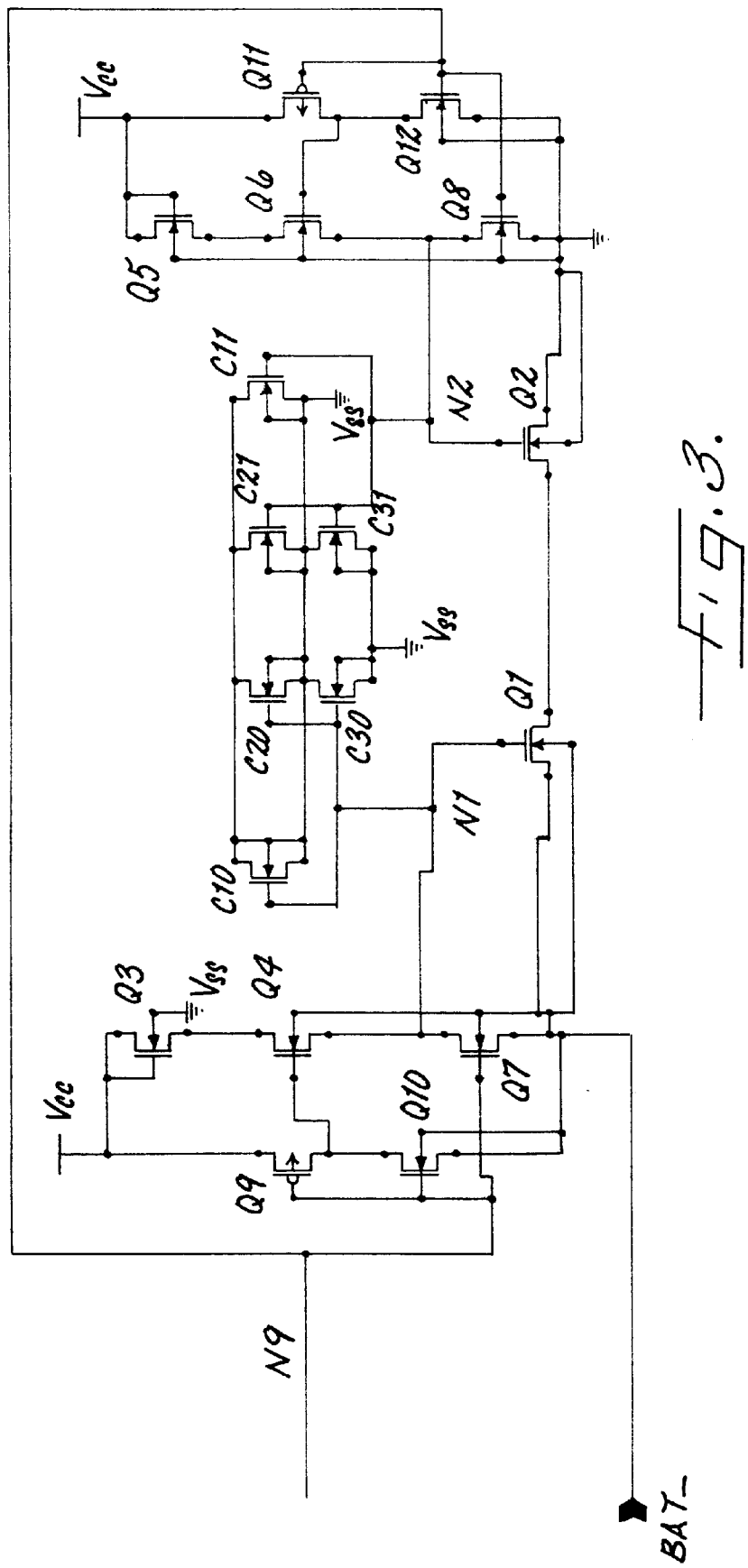
FIG. 3 is a schematic diagram of an integrated latch locking circuit of an integrated circuit for switching between an external power supply and a battery according to a first embodiment of the present invention.

The circuit illustrated in FIG. 3 is preferably used in FIG. 2 so when the substrate connected to the power supply $V_{CC}$ goes below 0.7 volts (V), the bat_signal (remains connected to ground $V_{SS}$ or the battery negative terminal will not float and corrupt the data in the memory circuit 35 and the clock circuit 100.

At the battery attachment, the bat_terminal is floating (FIG. 2) because nodes $N_1$ and $N_2$ (FIG. 3) are low. Also a plurality of capacitors C10, C20, C30, C11, C21, and C23 are pulling $N_1$ and $N_2$ nodes low which cause the bat_ terminal to be disconnected from $V_{SS}$. When the device is powered up externally, the logic circuit (FIG. 2) causes the drive node N9 (FIG. 3) to go high which forces node $N_1$ (FIG. 3) to be at the bat_signal level through a transistor Q7 and node $N_2$ (FIG. 3) at $V_{SS}$ through a transistor Q8. Then a pair of transistors Q1, Q2 are off and the battery is disconnected. During power down the external power node N9 will be driven low which makes a plurality of transistors Q3, Q4, Q5 and Q6 conduct and nodes $N_1$ and $N_2$ and capacitors C10, C20, C30, C11, C21 and C31 charge up to the power supply voltage $V_{CC}$–0.7V. The bat_signal will be connected to $V_{SS}$ through the transistors $Q_1$ and $Q_2$. The battery mode is then switched on. The only time the battery node is switched on is during external power down.

Figure 4:
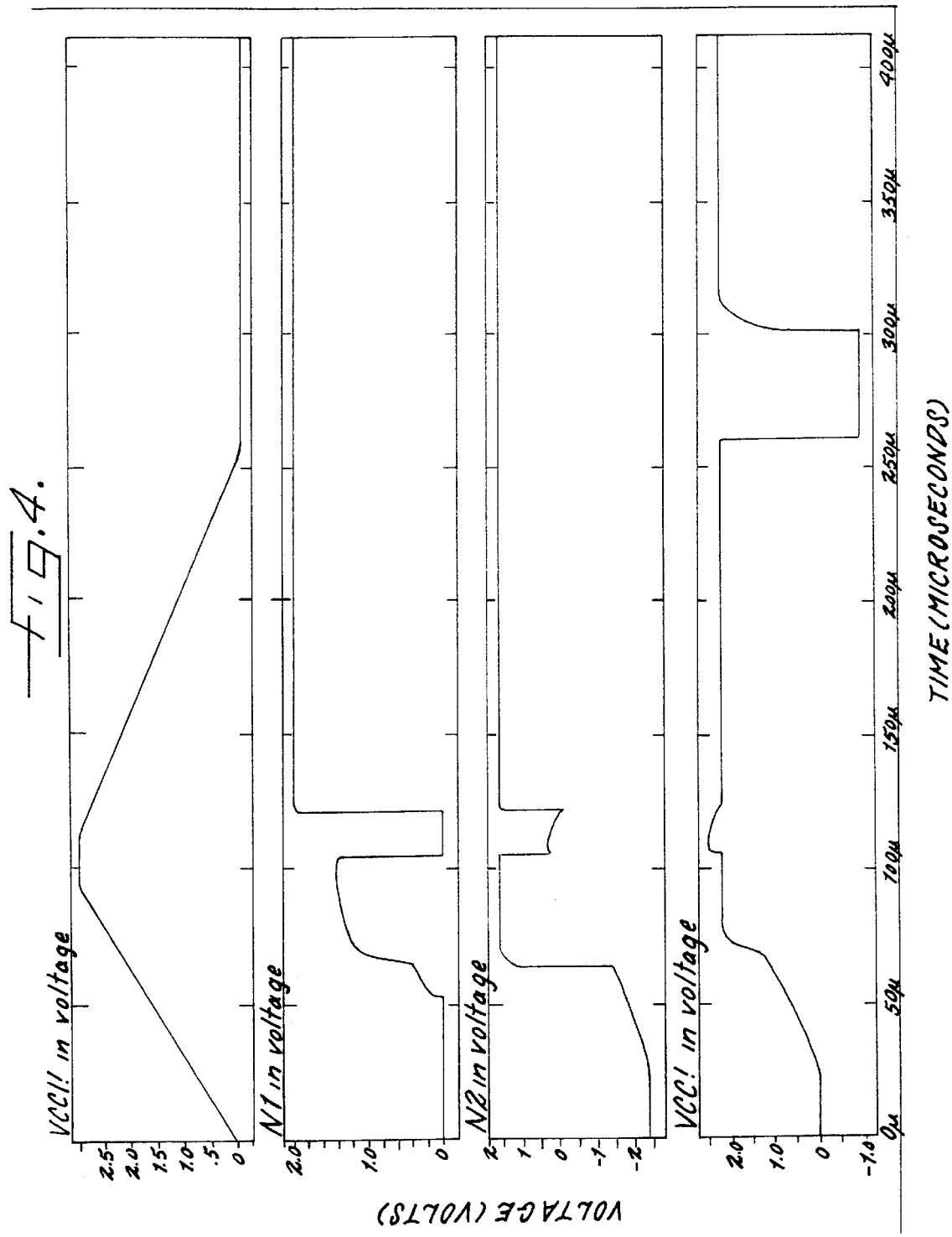
FIG. 4 is a graph of an external power supply voltage, voltage across two nodes of an integrated latch locking circuit, and external power supply voltage supplied to a substrate versus time for an integrated circuit for switching between an external power supply and a battery according to a first embodiment of the present invention.

When negative spikes two to three microseconds occur on any input pins and the substrate ($V_{CC}$) goes below zero, the transistors Q3 and Q5 are reversed bias (off), and the charge on nodes $N_1$ and $N_2$ are discharged at the rate of the junction leakage of the transistors Q3 and Q5 (FIG. 3) which will take two seconds to discharge. Because the negative spikes are two to three microseconds wide, nodes $N_1$ and $N_2$ (FIG. 3) remain high as indicated in (FIG. 4) and the bat_signal remains connected to ground $V_{SS}$ through the transistors Q1 and Q2. The logic will resolve itself (FIG. 2), and the power supply $V_{CC}$ will recover to the battery voltage and the data will not be distorted or corrupted.

Also, preferably on each node $N_1$ and $N_2$ (FIG. 3) there is 1 picoFarad ("pf") of total capacitors (not shown) to help maintain the charges on these two nodes $N_1$ and $N_2$. For a metal option, for example, these capacitors can be split to be used as 0.25 or 0.5 pf to reduce the loading on nodes $N_1$ and $N_2$. This can help minimize the switch over time from the external power supply $V_{CC}$ to the battery mode and vice versa.

Figure 5:
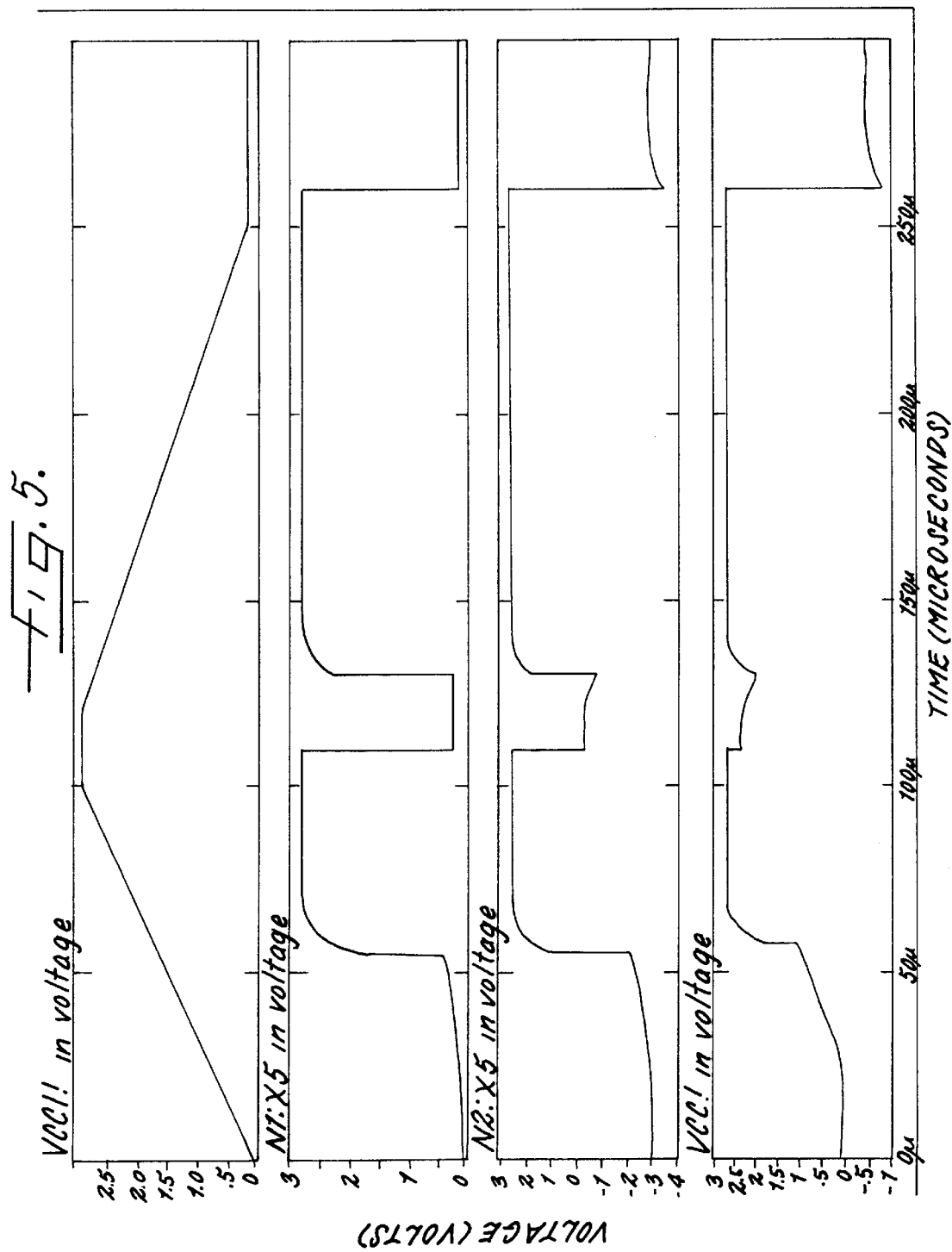
FIG. 5 is a graph of an external power supply voltage, voltage across two nodes of an integrated latch locking circuit, and external power supply voltage supplied to a substrate versus time for a prior art integrated circuit for switching between an external power supply and a battery without the integrated latch locking circuit.

FIG. 5 graphically illustrates an integrated circuit without the latch locking capabilities. If, for example, the transistors Q9 to Q12 were eliminated in the embodiment illustrated in FIG. 3 and the transistors Q3, Q4, Q5 and Q6 were replaced with a PMOS transistor, then when the power supply $V_{CC}$ goes below zero the forward bias diode will conduct and all the charges on nodes $N_1$ and $N_2$ will leak out immediately. The transistors Q1 and Q2 will turn off and the bat_signal will be disconnected and the data will be corrupted (FIG. 5).

As perhaps best illustrated in FIGS. 6–10, the operation of the sleep mode latching circuit 40' of a second embodiment of an integrated circuit 30' according to the present invention is further described herein. In this embodiment, it important to correctly set the latch upon battery attachment. This can be accomplished with the circuitry that generates a "batboot" signal. This generates a one-shot pulse upon the battery being attached to the device. The "bat" line is a direct connection to the positive terminal of the battery. When the battery is attached, the bat terminal or line goes high. Due primarily to an n-depletion capacitor C127, the batboot line is also coupled high, e.g., following the bat line high. The "batlag" line starts initially at ground or $V_{SS}$. As the power supply $V_{CC}$ rises ($V_{CC}$ is connected to the bat line through a resistor (i.e., 2 Kohms) and a p-channel transistor or switch and supplies power to the substrate), the batlag line follows, but is delayed. This filters noise as the battery is attached and connection is made and broken initially. A diode D54 is preferably sized quite weak. In series with the diode D54 is a teraohm ($10^{12}$) resistor R15 or resistors R12, R13, and R15. This diode/resistor combination drives an n-depletion capacitor C23 and a pulldown transistor Q83.

Figure 7:
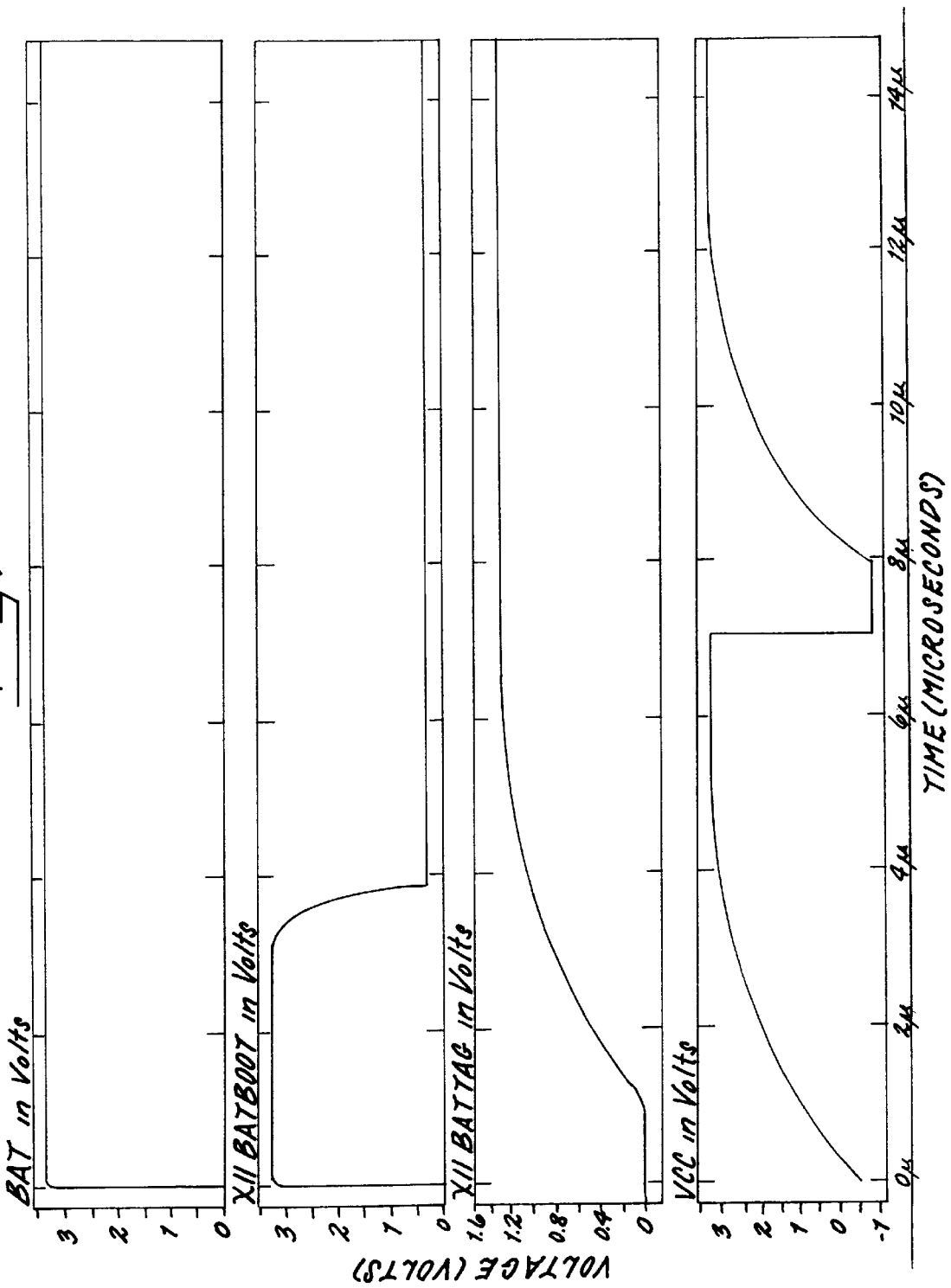
FIG. 7 is a graph of voltage versus time of battery, battery boot, battery lag, and external power supply connections of an integrated circuit for switching from an external power supply to a battery according to a second embodiment of the present invention.
Figure 8:
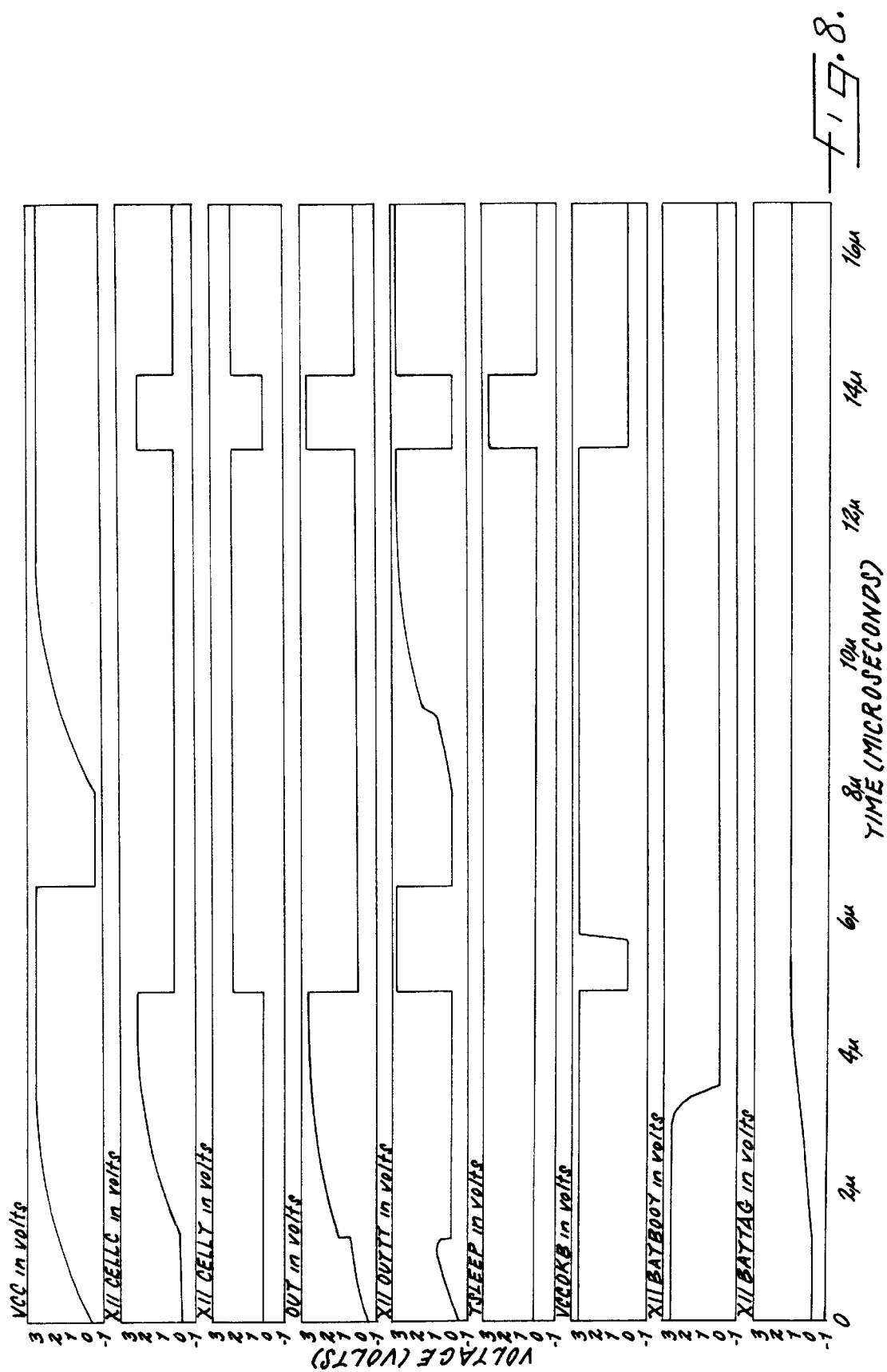
FIG. 8 is a graph of voltage versus time for external power supply and external power supply determining circuit connections, cellc and cellt connections of a memory circuit, out, outb, and sleep connections of a sleep mode latching circuit, and battery boot and battery lag connections of a battery and sleep mode latching circuit of an integrated circuit for switching from an external power supply to a battery according to a second embodiment of the present invention.

As perhaps best illustrated in FIG. 7, the batlag line slowly rises. When the batlag line rises past a threshold voltage $V_{TN}$, the pulldown transistor Q83 starts to conduct and discharges the batboot line. Thus, a pulse has been generated on the batboot line. Now if the power supply $V_{CC}$ is pulled negative, e.g., to –0.8 volts as shown in FIG. 7, the batlag line stays high. The diode D54 becomes reverse biased and the capacitor C23 holds the charge on the batlag line. This keeps the batboot line locked low. Thus, no more pulses are generated on the batboot line. The batboot line is used to initialize the sleep latch circuit at battery attach and should never be inadvertantly triggered thereafter. It can be used to initialize other circuitry as well.

Figure 6:
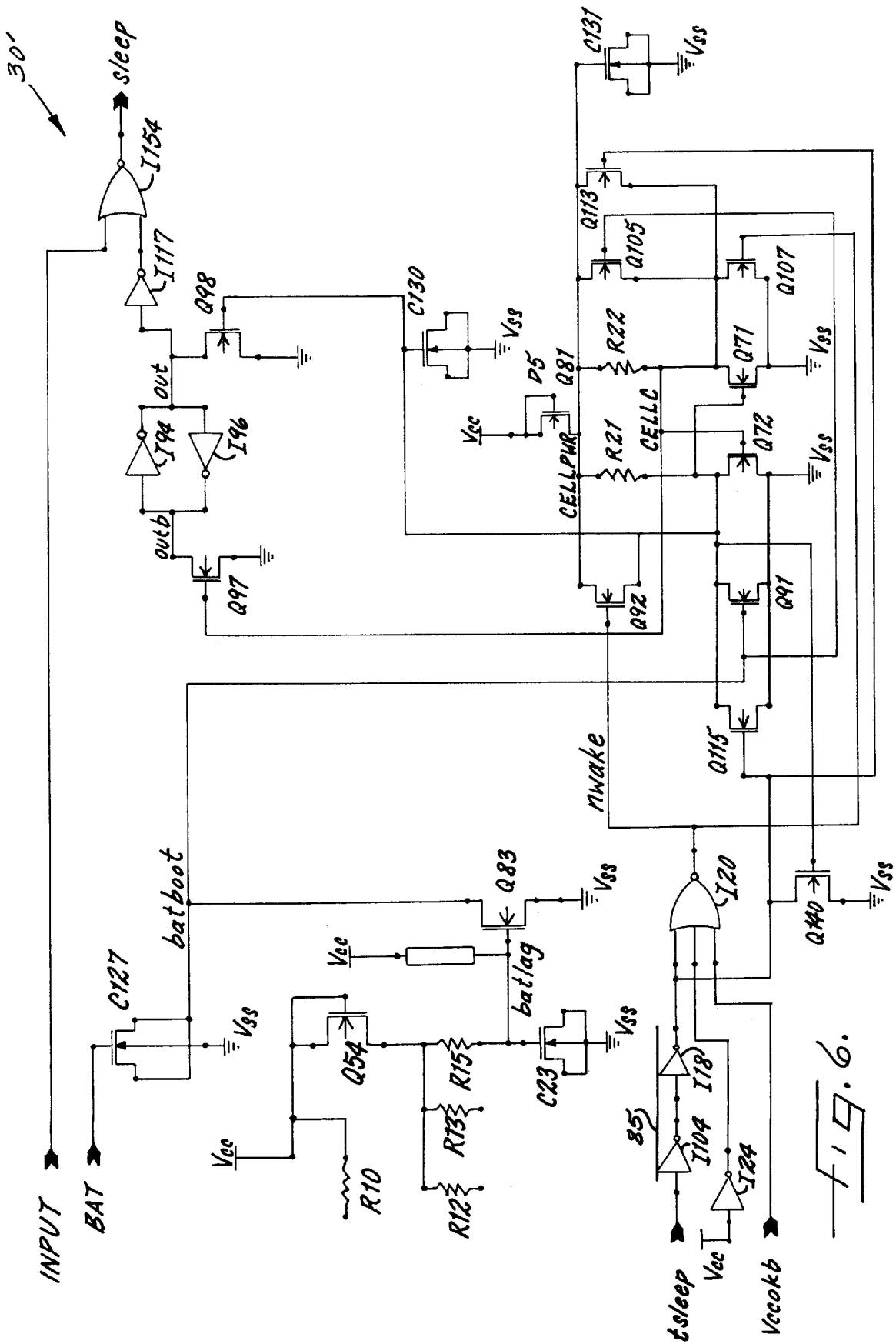
FIG. 6 is a schematic diagram of an integrated circuit for switching from an external power supply to a battery according to a second embodiment of the present invention.

The batboot signal is used to write a "0" to the memory cell array 35' illustrated in FIG. 6. The memory cell array 35' has polysilicon resistor loads connected to an n-channel diode which is connected to a transistor Q81. A plurality of n-channel source-followers Q105, Q92, and Q113 are used to establish the high level in the cell. Preferably, no p-diffusion exists in the cell structure. This is important because as the n-substrate gets pulled low, the p-diffusion forms a diode to the substrate which can pull the node connected to the p-diffusion low as well. The batboot line going high pulls "cellt" low and pulls "cellc" high. When the batboot line goes low, the cell maintains the data state. The two cell nodes cellt and cellc drive a pair of respective n-channel transistors Q97, Q99. These transistors Q97, Q99 control the latch formed by a pair of inverters I94 and I96. With cellc high, the transistor Q97 pulls "outb" low which makes "out" high. The "sleep" line is high and the device is in sleep mode.

As the power supply $V_{CC}$ is applied to the circuit 30', and the power supply $V_{CC}$ exceeds the battery voltage, the signal $V_{CCokb}$ goes low and causes "nwake" to go high. The transistor Q92 pulls "cellt" high and transistor Q107 pulls "cellc" low. The transistor Q99 pulls the out line low, and the outb line goes high. The sleep line is low and the device is not in sleep mode. The "tsleep" line is based on the contents of a register. When the tsleep line goes high, the ntsleep line goes high to switch back into sleep mode. An example of this function is graphically illustrated in FIG. 8.

The power supply or $V_{CC}$ to the cell is fed through an n-channel diode connected to the transistor Q81. If the power supply $V_{CC}$ gets pulled low, as it does in FIG. 8, the diode becomes reversed biased and does not conduct. A pair of n-depletion capacitors Q130, Q131 store the charge while this happens, and the cell maintains its state. The cell nodes cellt and cellc drive only the n-channel transistors Q97 and Q99 and connect to no p-channel gates. This is important because the high level on these nodes cellt, cellc may be limited to the power supply voltage $V_{CC}$—the threshold voltage $V_{TN}$ and would result in crowbar current through the p-channel.

Figure 9:
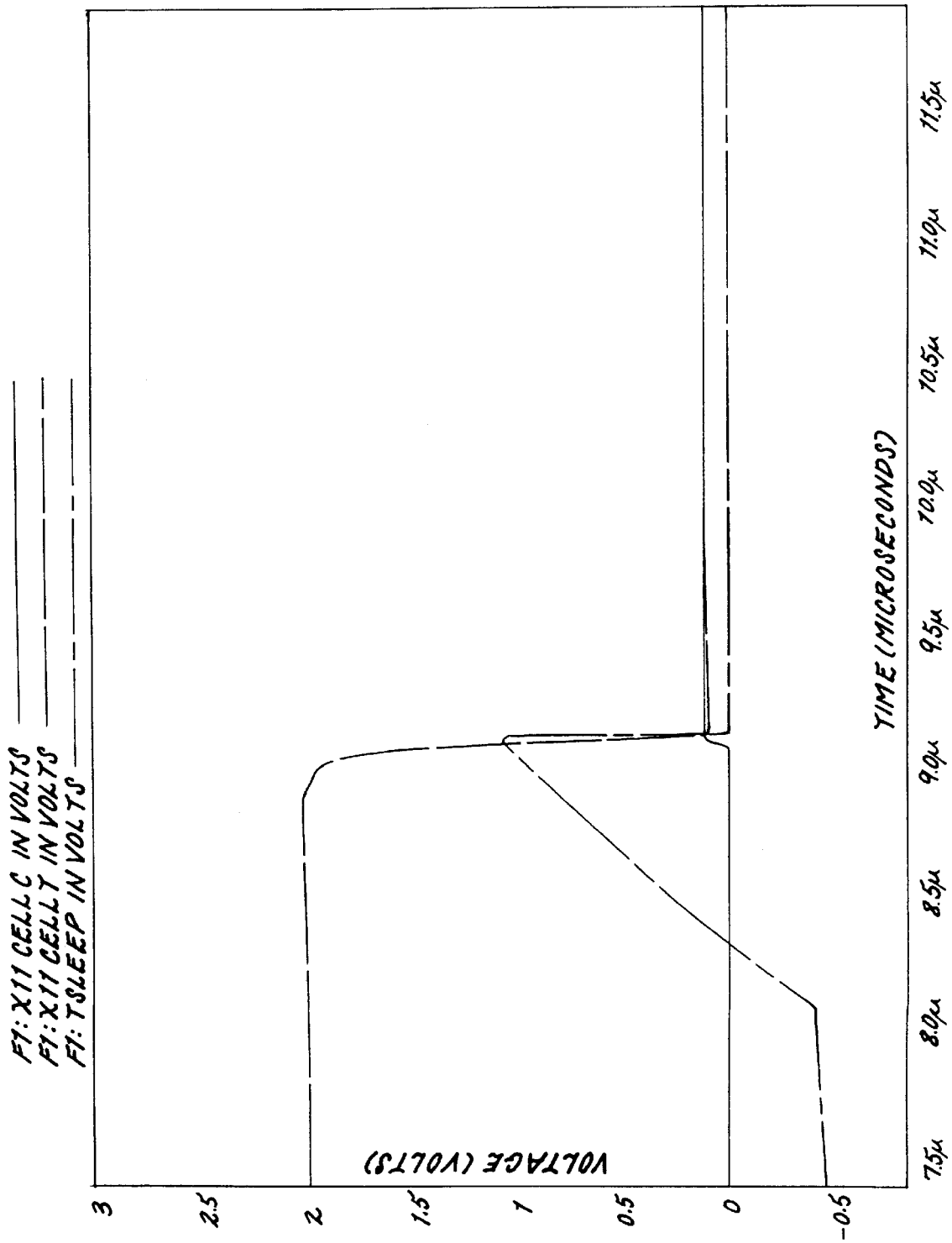
FIG. 9 is a graph of voltage versus time for cellc and cellt of a memory circuit and nsleep of a sleep mode latching circuit without a sleep mode latch locking circuit of a prior art integrated circuit for switching from an external power supply to a battery.

As shown, this structure allows for maintaining the state of the latch I94, I96, even as the power supply $V_{CC}$ goes below ground for several seconds. This can apply to other applications as well. One issue that may arise is that the states of logic gates may be unresolved until some minimum power supply voltage $V_{CC}$ level is maintained (usually around a voltage $V_{TN}$ or a voltage $|V_{TP}|$, whichever is greater). If logic is driving one side of the cell that forces a sleep mode, this may cause the cell to change state inadvertently. This case exists in FIG. 6, wherein inverter 18 drives the nsleep line. FIG. 9, for example, shows what can happen if a transistor Q140 is not present. As the power supply $V_{CC}$ rises back up from −0.8 volts, the ntsleep line is not resolved until about 9 microseconds, and then is a solid "0." Prior to this, it rises to over 1.0 volts as it couples with the power supply $V_{CC}$. This discharges cellt and destroys the data stored in the cell.

To combat this uncertainty and potential for corruption, the transistor Q140 is included. The drain of the transistor Q140 is tied to the ntsleep line, and the gate of the transistor Q140 is tied to cellt. This feedback locks the ntsleep line low when cellt is high during times when the power supply $V_{CC}$ is pulled low. The inverter I18 can overcome transistor Q140 when adequate power from the power supply $V_{CC}$ is present.

Figure 10:
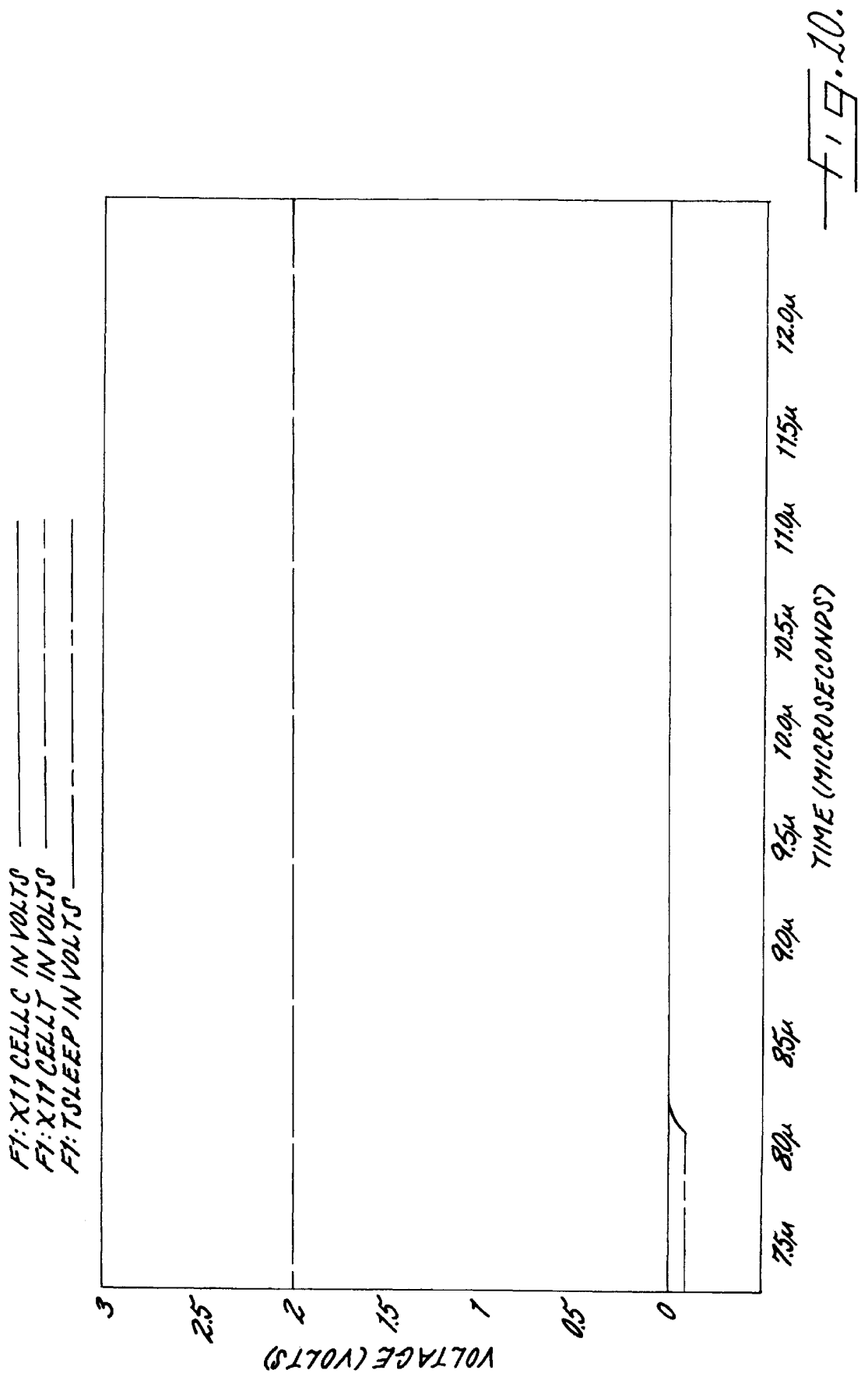
FIG. 10 is a graph of voltage versus time for cellc and cellt of a memory circuit and nsleep of a sleep mode latching circuit with a sleep mode latch locking circuit of an integrated circuit for switching from an external power supply to a battery according to the present invention.

FIG. 10 illustrates the result of adding this transistor Q140. In addition, a series of n-channel transistors with a gate tied to the power supply $V_{CC}$, a source tied to ground $V_{SS}$, and a drain connected to the source of transistor Q115 (currently shown connected to $V_{SS}$) can be added to reduce the ability of the transistor Q115 to pull cellt low during the uncertainty of when the power supply $V_{CC}$ is pulled low. This method can be useful to overcome indeterminate logic states during powerup, and can be applied to other circuits as well.

Figure 13:
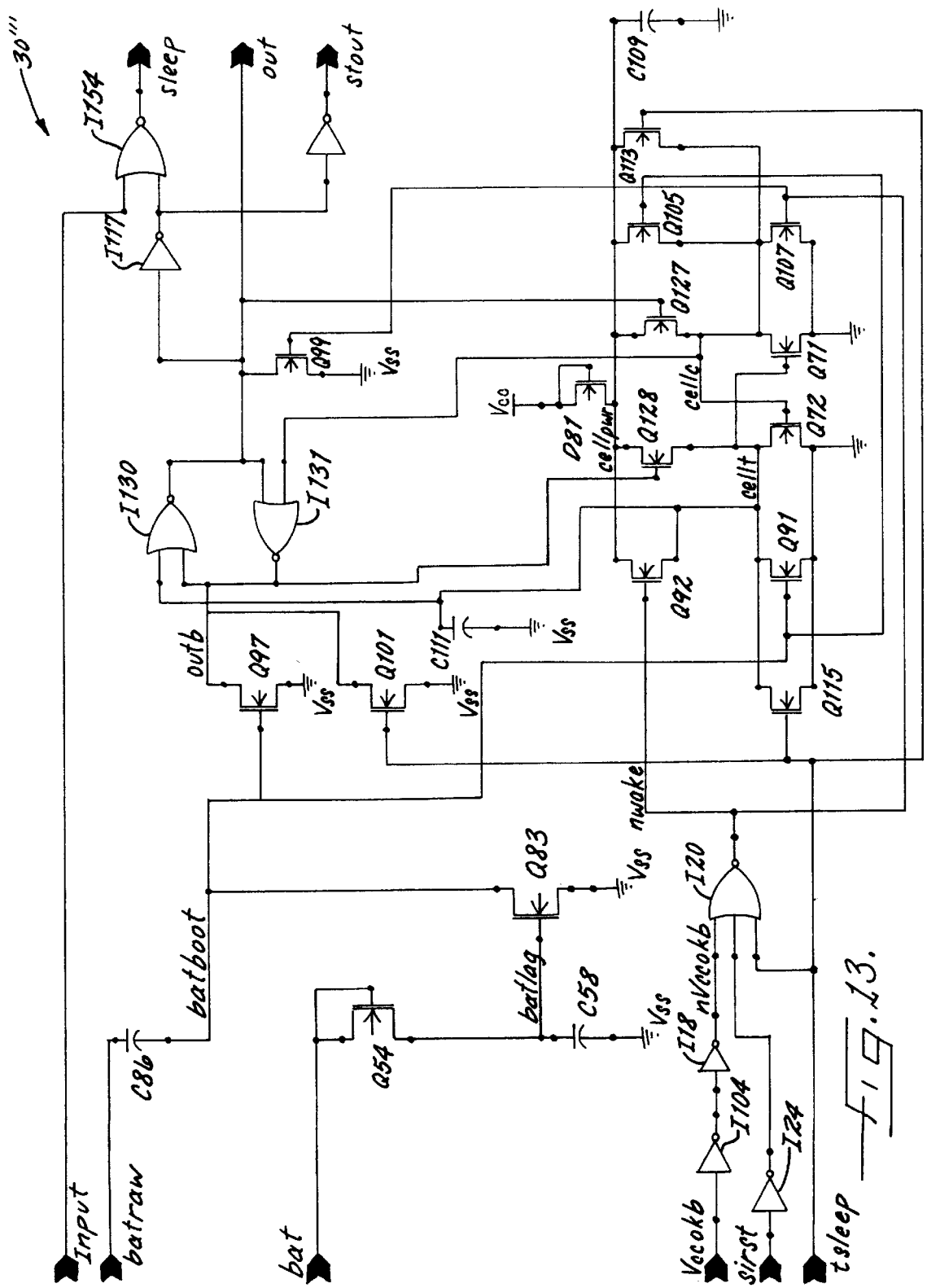
FIG. 13 is a schematic diagram of an integrated circuit for switching from an external power supply to a battery according to a fourth embodiment of the present invention.
Figure 15:
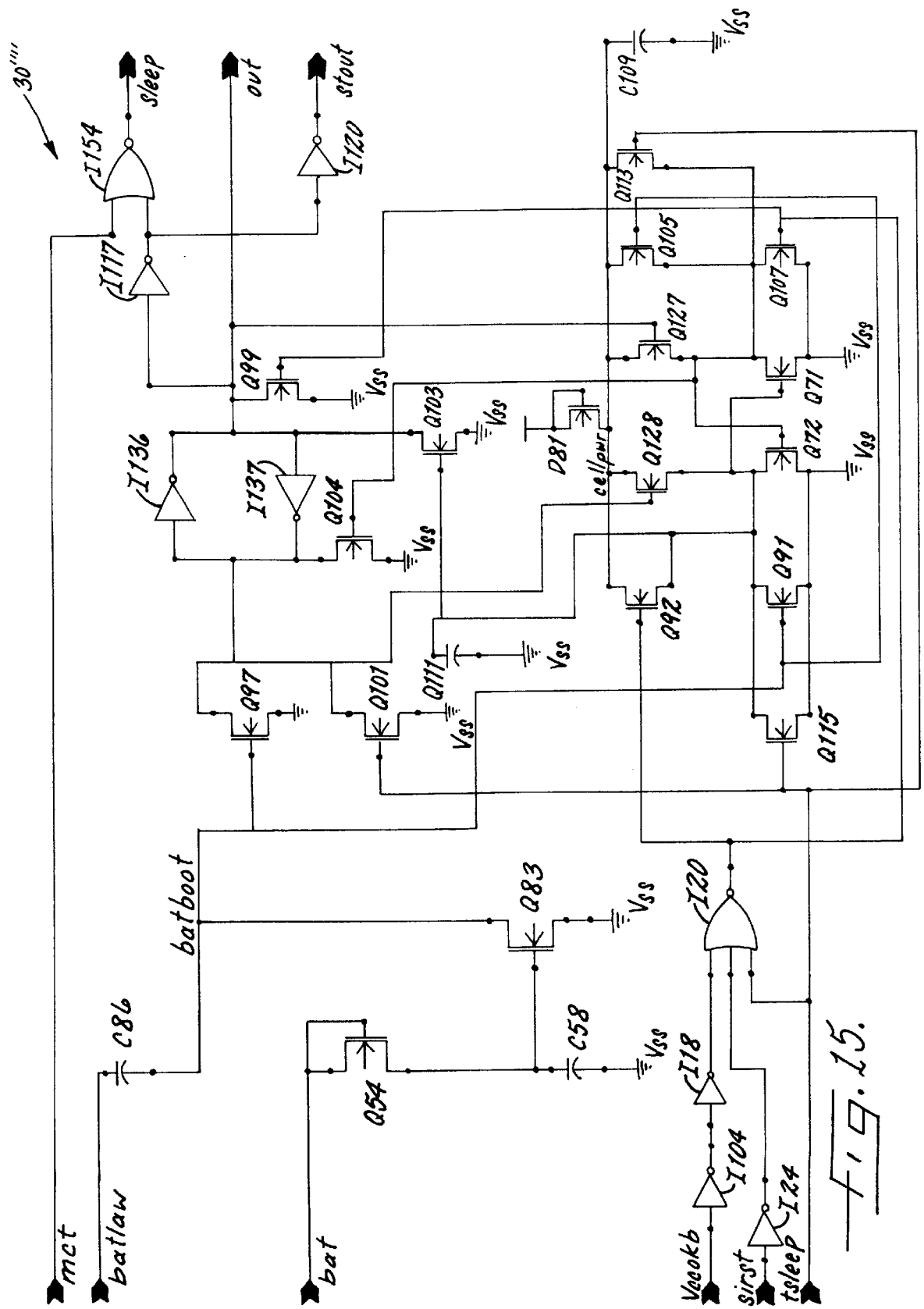
FIG. 15 is a schematic diagram of an integrated circuit for switching from an external power supply to a battery according to a fifth embodiment of the present invention.

As perhaps best shown in FIGS. 11, 13, and 15, the memory cell array 35 also, for example, can be a random access memory circuit devoid of any resistors formed of polysilicon. In these embodiments, the sleep mode latching circuit 40' preferably includes a steerable logic-based latch circuit also devoid of any resistors formed of polysilicon. The description is similar to FIG. 6 illustrated and described above, and much of the description only describes major differences for brevity purposes.

FIG. 11 shows a logic-based latch circuit 40" which does not require poly-R processing. The input or mct line is connected to an input of a NOR gate I154 which has an output connected to a sleep line. A pair of transistors Q143 and Q144 preferably are carefully sized n-channel devices that act as source follower pulleys. Their gates are driven by "out" and "outb" of a steerable latch, e.g., provided by a pair of inverters I94, I96. A transistor Q97 is preferably connected to the outb line, and a transistor Q98 is connected to the out line. The out line is also connected to an inverter I117 which has an output connected to the other input of the NOR gate I154 as illustrated.

The transistors Q143, Q144 are preferably sized weak relative to a plurality of n-channel pulldown transistors Q115, Q91, Q72, Q71 and Q107. If cellt is pulled low and cellc pulled high (say because "batboot" pulses high), the pulldown transistor Q91 must overcome the transistor Q144 initially (assuming outb is high). Because cellc is being pulled high, outb is pulled low, turning off the transistor Q144, and out goes high, turning on the transistor Q143, reinforcing cellc high, and cellt low. This state is latched. As can be seen, the cell latches in the other state when cellc is pulled low and cellt is pulled high.

Figure 12:
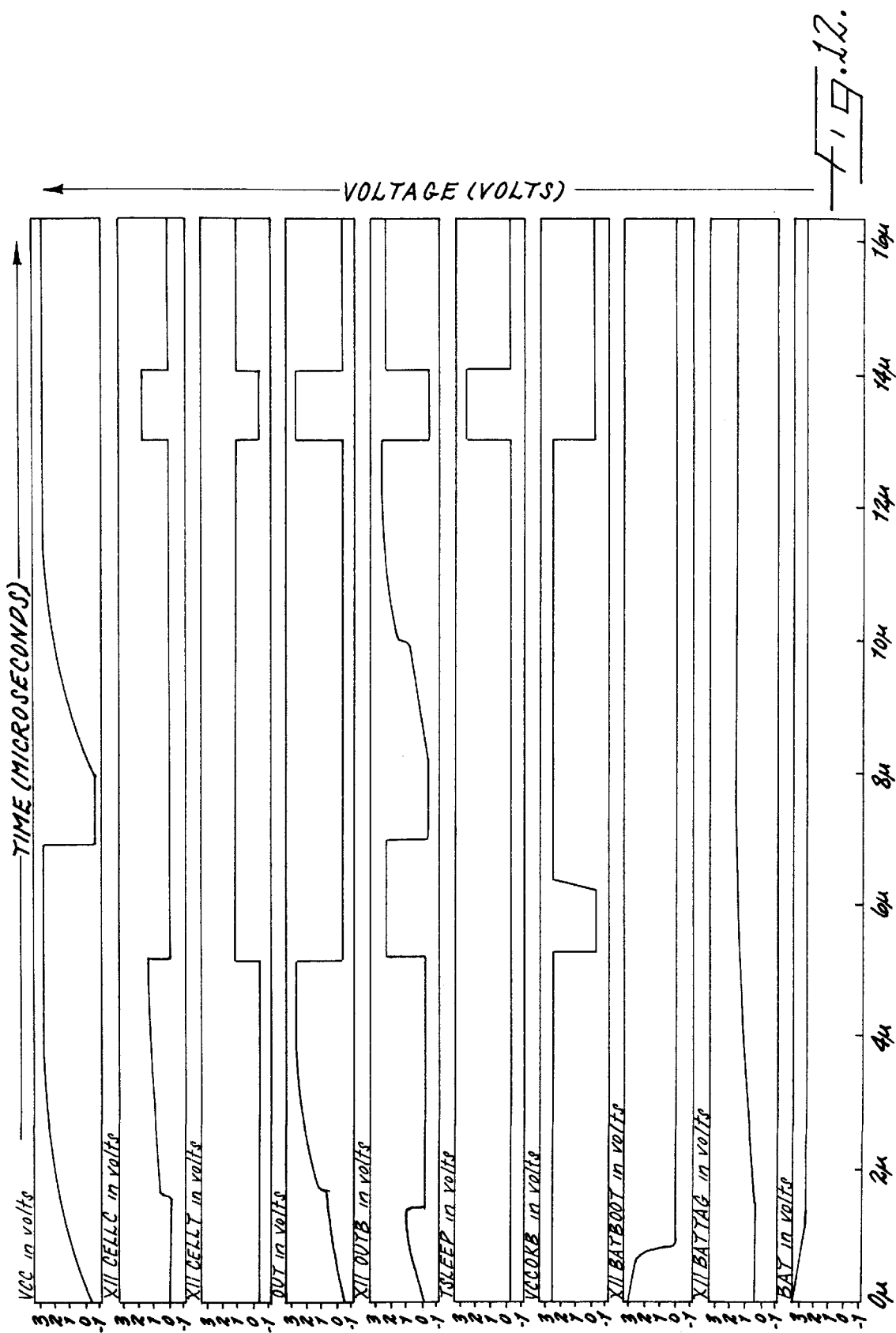
FIG. 12 is a graph of voltage versus time for external power supply and external power supply determining circuit connections, cellc and cellt connections of a memory circuit, out, outb, and sleep connections of a sleep mode latching circuit, and battery, battery boot, and battery lag connections of a battery and sleep mode latching circuit of an integrated circuit for switching from an external power supply to a battery according to a third embodiment of the present invention.

When the power supply $V_{CC}$ is pulled low, perhaps below ground due to an undershoot, a cellpwr charge is trapped because the transistor Q81 and/or diode D5 is reversed biased. The high side of the cell remains high, although the transistors Q143, Q144) may not be conducting, depending on the state of outb or out during the power failure. Because a high level is trapped in the cell (e.g., cellt), then cellc is locked to ground $V_{SS}$, out is locked to ground $V_{SS}$, and the transistor Q143 is not conducting. As mentioned, the transistor Q144 may or may not be conducting, depending on the state of outb, but the only discharge path is junction leakage (cellt has an additional capacitor Q130). When the power supply $V_{CC}$ returns high, the state of the cell correctly steers the latch I94, I96 which reinforces cellt and cellc. The polysilicon resistor connected to batlag is not a necessity because the transistor Q54 is preferably very weak. Much of the other portions of the circuit is similar to FIG. 6 as illustrated and described above. FIG. 12 graphically shows performance results of such a circuit 30".

Figure 14:
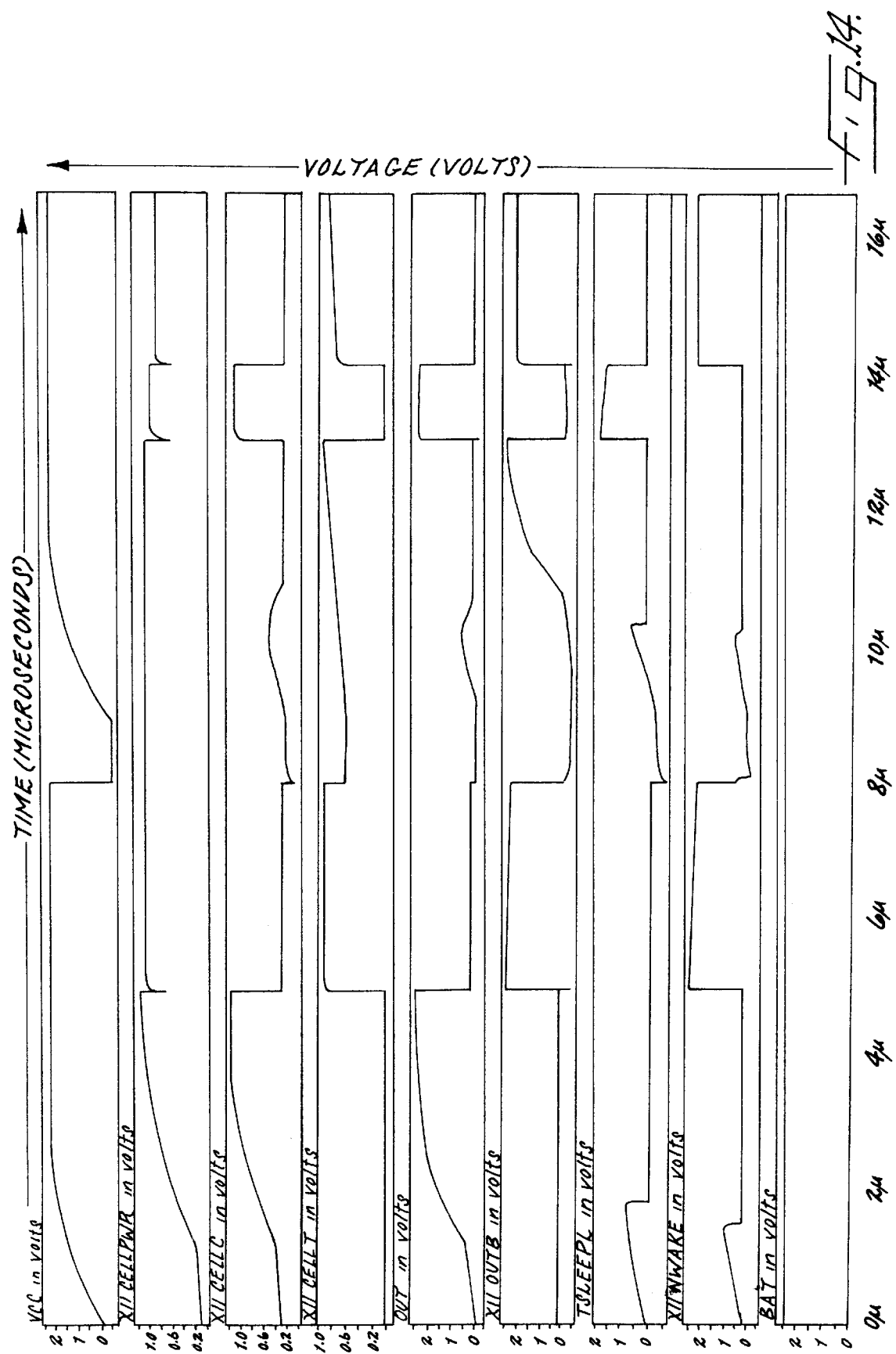
FIG. 14 is a graph of voltage versus time for an external power supply connection, cellpwr, cellc, and cellt connections of a memory circuit, out, outb, sleep, and wake connections of a sleep mode latching circuit, and a battery connection of a battery and sleep mode latching circuit of an integrated circuit for switching from an external power supply to a battery according to a fourth embodiment of the present invention.

FIG. 13 shows another version of the integrated circuit 30'', which has improved functionality at low power supply voltage $V_{CC}$. In this embodiment, the steerable latch is formed by a pair of NOR gates I130 and I131. The steerable latch is also steered by batboot, and tsleep and nwake are steered by transistors Q97, Q133 and Q99. FIG. 14 shows the performance results of this circuit at 2.5 volts. During the undershoot at about 8 microseconds, the cell high level (cellt) couples down from 1.09 volts to 0.77 volts, and then recovers. Cellc rises to 0.146 volts, then returns to 0 volts. The reason cellt couples down is due to the gate capacitance to the substrate of the p-channel in the NOR gate I130. As the power supply $V_{CC}$ falls, this couples cellt down.

Figure 16:
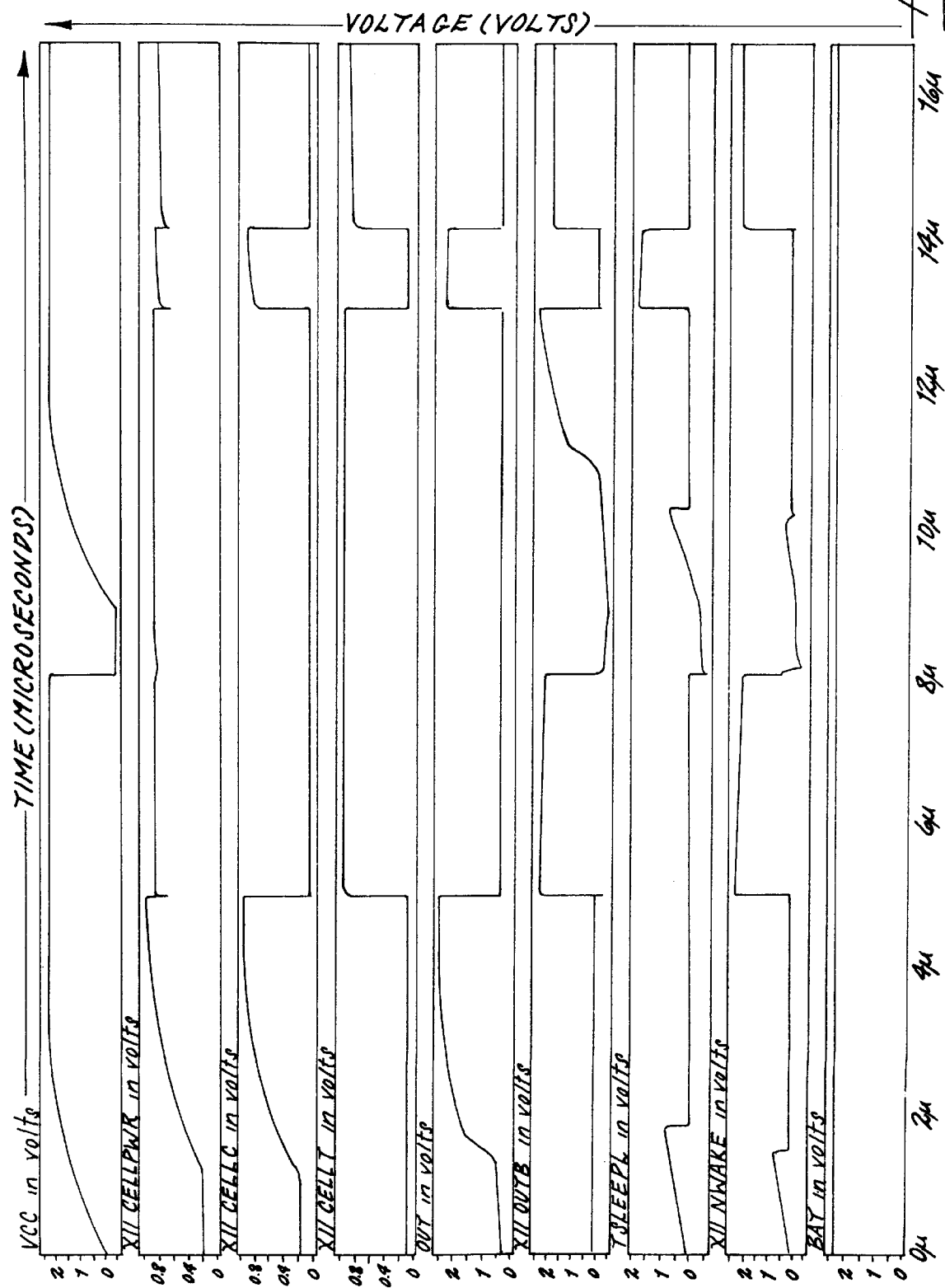
FIG. 16 is a graph of voltage versus time for an external power supply connection, cellpwr, cellc, and cellt connections of a memory circuit, out, outb, sleep, and wake connections of a sleep mode latching circuit, and a battery connection of a battery and sleep mode latching circuit of an integrated circuit for switching from an external power supply to a battery according to a fifth embodiment of the present invention.

FIG. 15 shows another embodiment of this integrated circuit 30''''', with the p-channels in the NOR gates removed. Cellt and cellc steer the latch with just the n-channel transistors Q134, and Q136. FIG. 16 shows the performance results. Here, during the undershoot, cellt stays at 1.10 volts and cellc at zero volts.

As illustrated in FIGS. 1–17, methods of switching from a power supply $V_{CC}$ to a battery B are advantageously also included according to the present invention. A method preferably includes latching a memory circuit 35 in a reduced power sleep mode condition so as to reduce power usage of a battery B and a non-sleep mode operating condition so as to allow normal operation of the memory circuit 35 by a power supply $V_{CC}$ and locking in the non-sleep mode operating condition when power supplied from the power supply falls below a predetermined threshold so that the memory circuit 35 is inhibited from inadvertently entering the reduced power sleep mode condition and thereby inhibiting corruption of data stored therein.

This method can also include determining when the power from the power supply $V_{CC}$ falls below the predetermined threshold. The determining preferably includes providing feedback on the power supply $V_{CC}$. The feedback is preferably provided by a feedback hysteresis circuit having a transistor Q140 connected to ground $V_{SS}$ and to the memory circuit 35.

The method can additionally include the locking step including the step of holding a charge so as to supply a predetermined amount of power to a memory circuit 35 for a predetermined period of time when the power from the power supply $V_{CC}$ falls below the predetermined threshold. The method can include providing timekeeping signals from a clock circuit 100 to a memory circuit 35, operating the clock circuit 100 in the reduced power operating condition, and switching a memory circuit 35 to a reduced power condition to thereby provide testing capabilities for a battery B being connected to the memory circuit 35. The method also includes initially connecting a power supply $V_{CC}$ to the memory circuit 35 after a battery B has been connected thereto and tested and exceeding a battery power supply threshold to thereby exit the reduced power operating condition and enter a normal operating condition.

Another method of switching from a power supply $V_{CC}$ to a battery B for an electronic circuit 30 preferably includes latching an electronic circuit 35 in a reduced power condition so as to reduce power usage of a battery B and a normal operating condition so as to allow normal operation of the electronic circuit 35 by a power supply and locking in the normal operating condition when power supplied from the power supply $V_{CC}$ falls below a predetermined threshold so that the electronic circuit 35 is inhibited from inadvertently entering the reduced power condition and thereby inhibiting corruption of data stored therein.

This method can also include determining when the power from the power supply $V_{CC}$ falls below the predetermined threshold. The determining step preferably includes providing feedback on the power supply $V_{CC}$. The feedback is preferably provided by a feedback hysteresis circuit having a transistor Q140 connected to ground $V_{SS}$ and to the electronic circuit 35.

The method can additionally include the locking step including the step of holding a charge so as to supply a predetermined amount of power to an electronic circuit 35 for a predetermined period of time when the power from the power supply $V_{CC}$ falls below the predetermined threshold. The method can include providing timekeeping signals from a clock circuit 100 to an electronic circuit 35 and operating the clock circuit 100 in the reduced power operating condition, and switching an electronic circuit 35 to a reduced power condition to thereby provide testing capabilities for a battery being connected to the electronic circuit 35. The method also includes initially connecting a power supply $V_{CC}$ to the electronic circuit 35 after a battery B has been connected thereto and tested and exceeding a battery power supply threshold to thereby exit the reduced power operating condition and enter a normal operating condition.

Yet another method of switching from a power supply $V_{CC}$ to a reduced power condition for an electronic circuit 35 preferably includes locking in a selected operating condition when power supplied from a power supply $V_{CC}$ falls below a predetermined threshold so that the electronic circuit 35 is inhibited from inadvertently entering a reduced power condition and thereby inhibiting corrupting data stored therein. This method can also include determining when the power from the power supply falls $V_{CC}$ below the predetermined threshold. The determining step preferably includes providing feedback on the power supply $V_{CC}$. The feedback is preferably provided by a feedback hysteresis circuit having a transistor Q140 connected to ground and to an electronic circuit 35.

This method can additionally include the locking step including the step of holding a charge so as to supply a predetermined amount of power to an electronic circuit 35 for a predetermined period of time when the power from the power supply $V_{CC}$ falls below the predetermined threshold. The method can include providing timekeeping signals from a clock circuit 100 to an electronic circuit 35 and operating the clock circuit 100 in the reduced power operating condition. The method can also include switching an electronic circuit such as a memory circuit 35 to a reduced power condition to thereby provide testing capabilities for a battery B being connected to the memory circuit 35 and initially connecting a power supply to the memory circuit 35 after a battery has been connected thereto and tested. The method further includes exceeding a battery power supply threshold to thereby exit the reduced power operating condition and enter a normal operating condition.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. An integrated circuit for switching from an external power supply to a backup battery associated with the integrated circuit to thereby preserve data in the event of loss of power from the external power supply, the integrated circuit comprising:

a memory cell array responsive to an external power supply and to a backup battery for storing data therein;

sleep mode latching means connected to said memory cell array for latching said memory cell array in a reduced power sleep mode condition so as to reduce power usage of a backup battery and a non-sleep mode operating condition so as to allow normal operation of said memory cell array by an external power supply; and sleep mode latch locking means connected to said sleep mode latching means and said memory cell array and responsive to an external power supply for locking said sleep mode latching means in the non-sleep mode operating condition when power supplied from the external power supply falls below a predetermined threshold so that said memory cell array is inhibited from inadvertently entering the reduced power sleep mode condition and thereby inhibiting corruption of data stored therein.

2. The integrated circuit as defined in claim 1, wherein said sleep mode latching means includes a register for retaining sleep mode operating data, and wherein said sleep mode latch locking means includes external power supply determining means connected to said register for determining when the power from the external power supply falls below the predetermined threshold.

3. The integrated circuit as defined in claim 2, wherein said external power supply determining means includes a feedback hysteresis circuit for providing hysteresis feedback on the power supply.

4. The integrated circuit as defined in claim 3, wherein said feedback hysteresis circuit includes an inverter circuit connected to said register and a transistor connected to said inverter circuit, a ground potential, and said memory cell array so as to lock the sleep mode operating data in said register when power from an external power supply falls below the predetermined threshold, said inverter circuit being responsive to power from an external power supply rising above the predetermined threshold so as to overcome said transistor.

5. The integrated circuit as defined in claim 1, wherein the sleep mode latch locking means includes charge holding means connected to said memory cell array and to an external power supply for holding a charge so as to supply a predetermined amount of power to said memory cell array for a predetermined period of time when the power from the external power supply falls below the predetermined threshold.

6. The integrated circuit as defined in claim 5, wherein said charge holding means includes at least one capacitor.

7. The integrated circuit as defined in claim 6, wherein said charge holding means further includes a transistor connected to the at least one capacitor and at least one diode forwardly biased from an external power supply and connected the transistor so that when power from the external power supply falls below the predetermined threshold the at least one diode inhibits a charge stored in the at least one capacitor from discharging.

8. The integrated circuit as defined in claim 1, further comprising a clock circuit connected to said memory cell array for providing timekeeping signals to said memory cell array, said clock circuit also being responsive to said sleep mode latching means to thereby also operate in the reduced power sleep mode condition.

9. The integrated circuit as defined in claim 8, wherein said sleep mode latching means is further responsive to a battery connecting condition to thereby provide testing capabilities for the backup battery associated with the integrated circuit.

10. The integrated circuit as defined in claim 9, wherein said sleep mode latching means is further responsive to an external power supply being initially supplied to the integrated circuit after a battery has been connected thereto and exceeding a battery power supply threshold to thereby exit the reduced power sleep mode condition and enter the non-sleep mode operating condition.

11. The integrated circuit as defined in claim 1, further comprising parasitic leaking means associated with at least said memory cell array for leaking at least one node of the at least said memory cell array down from a high voltage level.

12. The integrated circuit as defined in claim 11, wherein the at least said memory cell array is formed in a substrate having a first conductivity type and at least one well having a second conductivity type, and wherein the at least one memory cell array includes at least one diffusion region having the first conductivity type formed in the at least one well so that the combination of the at least one diffusion region, the at least one well, and the substrate forms a bipolar transistor at the at least one node of the at least said memory cell array and thereby define said parasitic leaking means.

13. The integrated circuit as defined in claim 1, wherein said memory cell array comprises a random access memory circuit devoid of any resistors formed of polysilicon.

14. The integrated circuit as defined in claim 13, wherein said sleep mode latching means includes a steerable logic-based latch circuit also devoid of any resistors formed of polysilicon.

15. The integrated circuit for switching from a power supply to a battery, the integrated circuit comprising:

a memory circuit responsive to a power supply and to a battery for storing data therein;

a sleep mode latching circuit connected to said memory circuit for latching said memory circuit in a reduced power sleep mode condition so as to reduce power usage of a battery and a non-sleep mode operating condition so as to allow normal operation of said memory circuit by a power supply; and a sleep mode latch locking circuit connected to said sleep mode latching circuit and said memory circuit and responsive to a power supply for locking said sleep mode latching circuit in the non-sleep mode operating condition when power supplied from the power supply falls below a predetermined threshold so that said memory circuit is inhibited from inadvertently entering the reduced power sleep mode condition.

16. The integrated circuit as defined in claim 15, wherein said sleep mode latching circuit includes a register for retaining sleep mode operating data, and wherein said sleep mode latch locking circuit includes power supply determining means connected to said register for determining when the power from the power supply falls below the predetermined threshold.

17. The integrated circuit as defined in claim 16, wherein said power supply determining means includes a feedback hysteresis circuit for providing hysteresis feedback on the power supply.

18. The integrated circuit as defined in claim 17, wherein said feedback hysteresis circuit includes an inverter circuit connected to said register and a transistor connected to said inverter circuit, a ground potential, and said memory circuit so as to lock the sleep mode operating data in said register when power from a power supply falls below the predetermined threshold, said inverter circuit being responsive to power from a power supply rising above the predetermined threshold so as to overcome said transistor.

19. The integrated circuit as defined in claim 18, wherein the sleep mode latch locking circuit includes a charge holding circuit connected to said memory circuit and to an external power supply for holding a charge so as to supply a predetermined amount of power to said memory circuit for a predetermined period of time when the power from the power supply falls below the predetermined threshold.

20. The integrated circuit as defined in claim 19, wherein said charge holding circuit includes at least one capacitor.

21. The integrated circuit as defined in claim 20, wherein said charge holding circuit further includes a transistor connected to the at least one capacitor and at least one diode forwardly biased from a power supply and connected the transistor so that when power from the power supply falls below the predetermined threshold the at least one diode inhibits a charge stored in the at least one capacitor from discharging.

22. The integrated circuit as defined in claim 21, further comprising a clock circuit connected to said memory circuit for providing timekeeping signals to said memory circuit, said clock circuit also being responsive to said sleep mode latching means to thereby also operate in the reduced power sleep mode condition.

23. The integrated circuit as defined in claim 22, wherein said sleep mode latching means is further responsive to a battery connecting condition to thereby provide testing capabilities for the battery.

24. The integrated circuit as defined in claim 23, wherein said sleep mode latching means is further responsive to a power supply initially supplying power to the integrated circuit after the battery is connected thereto and exceeding a battery power supply threshold to thereby exit the reduced power sleep mode condition and enter the non-sleep mode operating condition.

25. The integrated circuit as defined in claim 24, wherein the battery comprises a backup battery associated with the integrated circuit.

26. The integrated circuit as defined in claim 15, further comprising parasitic leaking means associated with at least said memory circuit for leaking at least one node of the at least said memory cell array down from a high voltage level.

27. The integrated circuit as defined in claim 26, wherein the at least said memory circuit is formed in a substrate having a first conductivity type and at least one well having a second conductivity type, and wherein the at least one memory circuit includes at least one diffusion region having the first conductivity type formed in the at least one well so that the combination of the at least one diffusion region, the at least one well, and the substrate forms a bipolar transistor at the at least one node of the at least said memory circuit and thereby define said parasitic leaking means.

28. The integrated circuit as defined in claim 15, wherein said memory cell array comprises a random access memory circuit devoid of any resistors formed of polysilicon.

29. The integrated circuit as defined in claim 28, wherein said sleep mode latching means includes a steerable logic-based latch circuit also devoid of any resistors formed of polysilicon.

30. The integrated latch locking circuit for connecting to a latch circuit and a memory circuit to inhibit the memory circuit from entering a reduced power sleep mode condition, the integrated latch locking circuit comprising:
    power supply determining means for determining when the power from a power supply falls below a predetermined threshold; and
    charge holding means for holding a charge so as to supply a predetermined amount of power to the memory circuit for a predetermined period of time when the power from the power supply falls below the predetermined threshold.

31. The integrated latch locking circuit as defined in claim 30, wherein the latching circuit includes a register for retaining sleep mode operating data.

32. The integrated latch locking circuit as defined in claim 31, wherein said power supply determining means includes a feedback hysteresis circuit for providing hysteresis feedback on the power supply.

33. The integrated latch locking circuit as defined in claim 32, wherein said feedback hysteresis circuit includes an inverter circuit for inverting sleep mode operating data from the register and a transistor connected to said inverter circuit, a ground potential, and the memory circuit so as to maintain the sleep mode operating data from the register in a selected condition when power from a power supply falls below the predetermined threshold, said inverter circuit being responsive to power from a power supply rising above the predetermined threshold so as to overcome said transistor.

34. The integrated latch locking circuit as defined in claim 33, wherein said charge holding circuit includes at least one capacitor.

35. The integrated circuit as defined in claim 34, wherein said charge holding circuit further includes a transistor connected to the at least one capacitor and at least one diode connected to and forwardly biased from a power supply and connected the transistor so that when power from the power supply falls below the predetermined threshold the at least one diode inhibits a charge stored in the at least one capacitor from discharging.

36. An integrated latch locking circuit for inhibiting latch entry into a reduced power mode, the integrated latch locking circuit comprising:
    a power supply determining circuit for determining when the power from a power supply falls below a predetermined threshold; and
    a charge holding circuit adapted to be connected to a latch circuit for holding a charge so as to supply a predetermined amount of power for a predetermined period of time when the power from the power supply falls below the predetermined threshold.

37. The integrated latch locking circuit as defined in claim 36, wherein the latch circuit includes a register for retaining reduce power operating data.

38. The integrated latch locking circuit as defined in claim 36, wherein said power supply determining means includes a feedback hysteresis circuit for providing hysteresis feedback on the power supply.

39. The integrated latch locking circuit as defined in claim 38, wherein said feedback hysteresis circuit includes an inverter circuit for inverting reduced mode operating data and a transistor connected to said inverter circuit, a ground potential, and the memory circuit so as to maintain the reduced power operating data from the register in a selected condition when power from a power supply falls below the predetermined threshold, said inverter circuit being responsive to power from a power supply rising above the predetermined threshold so as to overcome said transistor.

40. The integrated latch locking circuit as defined in claim 36, wherein said charge holding circuit includes at least one capacitor.

41. The integrated latch locking circuit as defined in claim 40, wherein said charge holding circuit further includes a transistor connected to the at least one capacitor and at least one diode connected to and forwardly biased from a power supply and connected the transistor so that when power from the power supply falls below the predetermined threshold the at least one diode inhibits a charge stored in the at least one capacitor from discharging.

42. A method of switching from a power supply to a battery comprising the steps of:

latching a memory circuit in a reduced power sleep mode condition so as to reduce power usage of a battery and a non-sleep mode operating condition so as to allow normal operation of the memory circuit by a power supply; and locking in the non-sleep mode operating condition when power supplied from the power supply falls below a predetermined threshold so that the memory circuit is inhibited from inadvertently entering the reduced power sleep mode condition and thereby inhibiting corruption of data stored therein.

43. The method as defined in claim 42, wherein the locking step includes determining when the power from the power supply falls below the predetermined threshold.

44. The method as defined in claim 43, wherein the step of determining includes providing feedback on the power supply.

45. The method as defined in claim 43, wherein the step of providing feedback includes providing a feedback hysteresis circuit having a transistor connected to ground and to a memory circuit.

46. The method as defined in claim 43, wherein the locking step further includes holding a charge so as to supply a predetermined amount of power to a memory circuit for a predetermined period of time when the power from the power supply falls below the predetermined threshold.

47. The method as defined in claim 42, further comprising providing timekeeping signals from a clock circuit to a memory circuit and operating the clock circuit in the reduced power operating condition.

48. The method as defined in claim 42, further comprising switching a memory circuit to a reduced power condition to thereby provide testing capabilities for a battery being connected to the memory circuit.

49. The method as defined in claim 48, further comprising initially connecting a power supply to the memory circuit after a battery has been connected thereto and tested and exceeding a battery power supply threshold to thereby exit the reduced power operating condition and enter a normal operating condition.

50. A method of switching from a power supply to a battery for an electronic circuit comprising the steps of:

latching an electronic circuit in a reduced power condition so as to reduce power usage of a battery and an normal operating condition so as to allow normal operation of the electronic circuit by a power supply; and locking in the normal operating condition when power supplied from the power supply falls below a predetermined threshold so that the electronic circuit is inhibited from inadvertently entering the reduced power condition and thereby inhibiting corruption of data stored therein.

51. The method as defined in claim 50, wherein the locking step includes determining when the power from the power supply falls below the predetermined threshold.

52. The method as defined in claim 51, wherein the step of determining includes providing feedback on the power supply.

53. The method as defined in claim 52, wherein the step of providing feedback includes providing a feedback hysteresis circuit having a transistor connected to ground and to an electronic circuit.

54. The method as defined in claim 53, wherein the locking step further includes holding a charge so as to supply a predetermined amount of power to an electronic circuit for a predetermined period of time when the power from the power supply falls below the predetermined threshold.

55. The method as defined in claim 54, further comprising providing timekeeping signals from a clock circuit to an electronic circuit and operating the clock circuit in reduced power condition.

56. The method as defined in claim 55, further comprising switching an electronic circuit to a reduced power condition to thereby provide testing capabilities for a battery being connected to the electronic circuit.

57. The method as defined in claim 56, further comprising initially connecting a power supply to the electronic circuit after a battery has been connected thereto and tested and exceeding a battery power supply threshold to thereby exit the reduced power condition and enter a normal operating condition.

58. The method of switching from a power supply to a reduced power condition for an electronic circuit comprising the step of locking in a selected operating condition when power supplied from a power supply falls below a predetermined threshold so that the electronic circuit is inhibited from inadvertently entering a reduced power condition and thereby inhibiting corruption of data stored therein.

59. The method as defined in claim 58, wherein the locking step includes determining when the power from the power supply falls below the predetermined threshold.

60. The method as defined in claim 59, wherein the step of determining includes providing feedback on the power supply.

61. The method as defined in claim 60, wherein the step of providing feedback includes providing a feedback hysteresis circuit having a transistor connected to ground and to an electronic circuit.

62. The method as defined in claim 59, wherein the locking step further includes holding a charge so as to supply a predetermined amount of power to an electronic circuit for a predetermined period of time when the power from the power supply falls below the predetermined threshold.

63. The method as defined in claim 58, further comprising providing timekeeping signals from a clock circuit to an electronic circuit and operating the clock circuit in reduced power condition.

64. The method as defined in claim 58, further comprising switching an electronic circuit to a reduced power condition to thereby provide testing capabilities for a reduced power condition.

65. The method as defined in claim 64, further comprising initially connecting a power supply to the electronic circuit after the reduced power condition has been tested and exceeding a reduced power supply threshold to thereby exit the reduced power condition and enter a normal operating condition.

* * * * *